(12) United States Patent
Ishida et al.

(10) Patent No.: US 8,497,562 B2
(45) Date of Patent: Jul. 30, 2013

(54) SOLID-STATE IMAGE PICKUP DEVICE

(75) Inventors: Yukimasa Ishida, Shiojiri (JP); Takashi Sato, Chino (JP); Yasushi Yamazaki, Azumino (JP)

(73) Assignee: Epson Imaging Devices Corporation, Azumino-shi (JP)

( * ) Notice: Subject to any disclaimer, the term of this patent is extended or adjusted under 35 U.S.C. 154(b) by 4 days.

(21) Appl. No.: 13/180,211

(22) Filed: Jul. 11, 2011

(65) Prior Publication Data

US 2011/0266599 A1 Nov. 3, 2011

Related U.S. Application Data

(62) Division of application No. 12/366,313, filed on Feb. 5, 2009, now abandoned.

(30) Foreign Application Priority Data

Apr. 23, 2008 (JP) .................................. 2008-112133
Dec. 16, 2008 (JP) .................................. 2008-319271

(51) Int. Cl.
H01L 31/102 (2006.01)
H01L 27/148 (2006.01)
G01T 1/24 (2006.01)

(52) U.S. Cl.
USPC .................. 257/458; 257/231; 257/E31.124; 250/370.14

(58) Field of Classification Search
USPC .................... 257/458, 231; 250/370.08, 370, 250/14
See application file for complete search history.

(56) References Cited

U.S. PATENT DOCUMENTS

| 5,079,426 | A | 1/1992 | Antonuk et al. |
| 6,407,418 | B1 * | 6/2002 | Haga et al. ..................... 257/294 |
| 6,437,370 | B1 | 8/2002 | Matsuno |
| 6,815,658 | B2 | 11/2004 | Okada et al. |
| 7,535,506 | B2 | 5/2009 | Nomura et al. |
| 7,812,313 | B2 | 10/2010 | Mochizuki et al. |
| 2007/0164333 | A1 | 7/2007 | Wright |
| 2007/0210257 | A1 * | 9/2007 | Masuda et al. ........... 250/370.09 |
| 2008/0237474 | A1 | 10/2008 | Tonotani |
| 2008/0245968 | A1 * | 10/2008 | Tredwell et al. ......... 250/370.09 |
| 2009/0026509 | A1 * | 1/2009 | Hayashi et al. ............... 257/292 |
| 2009/0040310 | A1 | 2/2009 | Nomura et al. |
| 2009/0251653 | A1 | 10/2009 | Hayashi |

FOREIGN PATENT DOCUMENTS

| CN | 1748314 A | 3/2006 |
| JP | A-06-120474 | 4/1994 |
| JP | A-08-335687 | 12/1996 |
| JP | A-2000-131444 | 5/2000 |
| JP | A 2000-156522 | 6/2000 |

(Continued)

*Primary Examiner* — Daniel Luke
(74) *Attorney, Agent, or Firm* — Oliff & Berridge, PLC

(57) ABSTRACT

A solid-state image pickup device is provided which includes a substrate; a transistor formed on the substrate; a photoelectric conversion element including a first electrode connected to a drain or a source of the transistor, a semiconductor layer stacked on the first electrode, and a second electrode stacked on the semiconductor layer; an insulating layer disposed on the second electrode; and a bias line formed on the insulating layer to be connected to the second electrode, in which the insulating layer contains at least an inorganic insulating film, and the bias line is connected to the second electrode via a contact hole formed in the insulating layer, and a side surface of the semiconductor layer is in contact with the inorganic insulating film.

10 Claims, 12 Drawing Sheets

FOREIGN PATENT DOCUMENTS

| | | |
|---|---|---|
| JP | B2-3050402 | 6/2000 |
| JP | B2-3144091 | 3/2001 |
| JP | A 2003-133537 | 5/2003 |
| JP | A 2003-258215 | 9/2003 |
| JP | A 2005-116543 | 4/2005 |
| JP | A 2007-49124 | 2/2007 |
| JP | A-2009-251174 | 10/2009 |
| WO | WO 91/03745 A1 | 3/1991 |

* cited by examiner

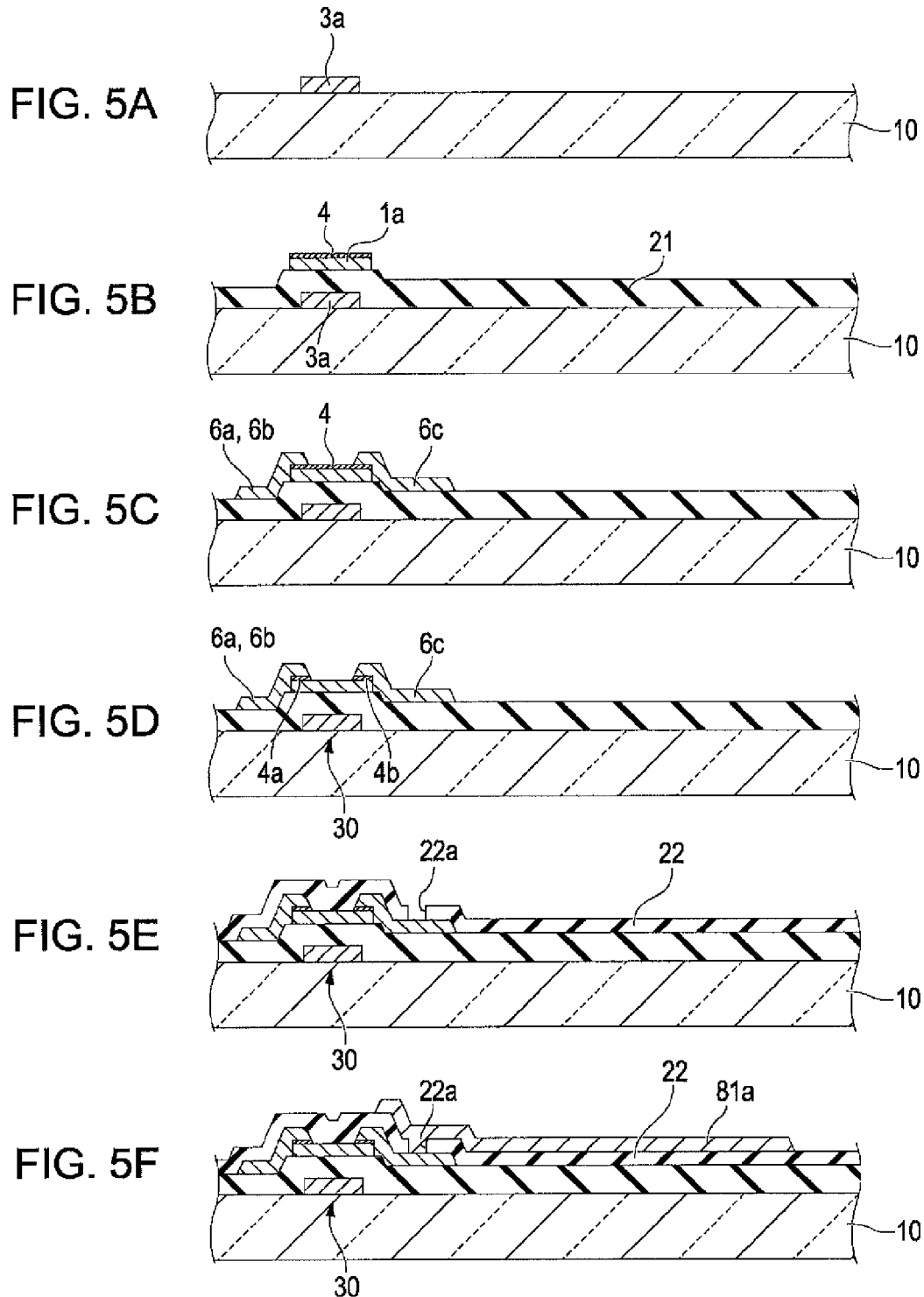

SOLID-STATE IMAGE PICKUP DEVICE

CROSS REFERENCES TO RELATED APPLICATIONS

This is a Divisional of U.S. patent application Ser. No. 12/366,313 filed Feb. 5, 2009, which claims priority to Japanese Patent Application Nos. 2008-112113, filed Apr. 23, 2008 and 2008-319271, filed Dec. 16, 2008. The disclosure of each of these prior applications is incorporated herein by reference in its entirety.

BACKGROUND

1. Technical Field

The present invention relates to a solid-state image pickup device for converting incident light into electrical signals and to a manufacturing method thereof.

2. Related Art

In medical image diagnosis or non-destructive inspection, imaging is performed using radioactive rays such as X rays. However, since a reduction optical system is difficult to implement in imaging of the radioactive rays, the imaging is necessarily performed at the same magnification. Therefore, the medical image diagnosis or the non-destructive inspection requires a large imaging surface, and thus, a solid-state image pickup device having a variety of type of thin films deposited on a glass substrate or the like so that a plurality of pixels is arranged in a matrix form is used. Even when a 2-dimensional image sensor is configured by a solid-state image pickup device, since the image sensor requires a large imaging surface, a variety of type of thin films are deposited on a glass substrate or the like so that a plurality of pixels is arranged in a matrix form.

In such a solid-state image pickup device, each of the plurality of pixels includes a photoelectric conversion element capable of generating electric charges corresponding to an incident light intensity and a field-effect transistor having a drain thereof being electrically connected to a first electrode of the photoelectric conversion element. The gate and the source of the field-effect transistor are electrically connected to a gate line and a source line, respectively, and a bias line is electrically connected to a second electrode of the photoelectric conversion element. The solid-state image pickup device has a structure in which the field-effect transistor, the photoelectric conversion element, an insulating film and the bias line are formed in this order from a lower side of a substrate toward an upper side thereof. Therefore, when the solid-state image pickup device is formed, it is necessary to electrically connect the first electrode of the photoelectric conversion element to the drain of the field-effect transistor and to electrically connect the second electrode of the photoelectric conversion element to the bias line while forming the respective layers on the substrate in order.

As a connection structure for electrically connecting the first electrode of the photoelectric conversion element to the drain of the field-effect transistor, there is proposed a structure in which contact holes are formed in an insulating film on the substrate covering the photoelectric conversion element and the field-effect transistor so as to be disposed at a position where it overlaps with the second electrode of the photoelectric conversion element and a position where it overlaps with the drain electrode of the field-effect transistor, and in which connection wirings formed on the insulating film are electrically connected to the second electrode of the photoelectric conversion element and the drain electrode of the field-effect transistor via the contact holes (reference should be made to, for example, JP-B-3144091).

As a connection structure for electrically connecting the second electrode of the photoelectric conversion element to the bias line, there is proposed a structure in which the bias line is formed on an upper layer of the photoelectric conversion element, and a polyimide film is provided as an insulating material between the upper layer of the transistor and the photoelectric conversion element (reference should be made to, for example, JP-B-3050402).

However, when the structure disclosed in JP-B-3144091 is employed in electrically connecting the photoelectric conversion element and the field-effect transistor, it is necessary to form a number of contact holes on an upper layer side of the photoelectric conversion element. Therefore, there is a problem that the forming region of the photoelectric conversion element is reduced, and thus, the sensitivity decreases.

Moreover, when the structure disclosed in JP-B-3050402 is employed in electrically connecting the second electrode of the photoelectric conversion element and the bias line, the polyimide film may come into contact with a side surface of the photoelectric conversion element. Therefore, there is a problem that the semiconductor layer deteriorates with moisture contained in the polyimide film which is an organic film, and thus, the photoelectric conversion element deteriorates.

SUMMARY

An advantage of some aspects of the invention is that it provides a solid-state image pickup device and a manufacturing method thereof capable of providing reliable electrical connection between a photoelectric conversion element and a bias line and electrically connecting the photoelectric conversion element and a field-effect transistor with fewer contact holes.

According to an aspect of the invention, there is provided a solid-state image pickup device which includes: a substrate; a transistor formed on the substrate; a photoelectric conversion element including a first electrode connected to a drain or a source of the transistor, a semiconductor layer stacked on the first electrode, and a second electrode stacked on the semiconductor layer; an insulating layer disposed on the second electrode; and a bias line formed on the insulating layer to be connected to the second electrode, wherein the insulating layer contains at least an inorganic insulating film, and wherein the bias line is connected to the second electrode via a contact hole formed in the insulating layer, and a side surface of the semiconductor layer is in contact with the inorganic insulating film.

According to the configuration, a field-effect transistor can be typically used as the transistor, and the gate and the source or drain of the transistor are connected to the gate line and the source line or drain line formed in the substrate, respectively. The transistor, the photoelectric conversion element, the insulating layer and the bias line are formed in this order from the lower side of the substrate toward the upper side thereof, and the first electrode of the photoelectric conversion element is electrically connected to the drain or the source of the transistor via the contact hole provided in the insulating film disposed on a lower side of the first electrode.

In the configuration, the semiconductor layer contains a plurality of stacked semiconductor films. More specifically, a P-type semiconductor film, an I-type semiconductor film and an N-type semiconductor film are stacked. In this case, any of a configuration in which the P-type semiconductor film is disposed on the first electrode side and the N-type semiconductor film is disposed on the second electrode side so that the anode of the photoelectric conversion element is connected to the drain or the source of the transistor, and a configuration in which the N-type semiconductor film is disposed on the first electrode side and the P-type semiconductor film is disposed on the second electrode side so that the cathode of the photoelectric conversion element is connected to the drain or the source of the transistor may be employed. In addition, the photoelectric conversion element is not limited to the PIN type photodiode, but a PN type photodiode may be used for example.

The insulating layer formed on the second electrode contains an inorganic insulating film formed, for example, of a silicon nitride film, which is an inorganic film. Moreover, the inorganic insulating film is formed to be in contact with the second electrode, preferably with the side surface of the semiconductor layer so as to cover them. In the solid-state image pickup device having such a configuration, the side surface of the semiconductor layer is disposed to be in contact with the inorganic film, and preferably, the semiconductor layer and the second electrode are covered with the inorganic film. Owing to such a configuration, the semiconductor layer and the second electrode are protected by the inorganic film from coming into contact with moisture or air during or after the manufacturing process such as the process for forming the bias line. Therefore, the photoelectric conversion element is not likely to deteriorate, and thus, the reliability of the solid-state image pickup device can be increased.

Moreover, when the insulating layer being in contact with the semiconductor layer of the photoelectric conversion element is formed of an organic film such as photosensitive resin, the organic film may be left in a contact hole when the contact hole is formed in the insulating layer by exposure and development. Thus, there is a fear that the electrical connection between the second electrode and the bias line might not be carried out in a reliable manner.

According to the solid-state image pickup device of the invention, since the contact hole can be formed by etching the inorganic insulating film using a photolithography technique, for example, in a state where a resist mask is formed thereon, it is possible to reliably form the contact hole at a position where it overlaps with the second electrode. Therefore, it is possible to reliably prevent a situation where the insulating film is unintendedly left on the second electrode, and thus, the electrical connection between the second electrode and the bias line can be carried out in a reliable manner. Furthermore, by forming the top protection layer on the insulating layer so as to cover the bias line, it is possible to prevent the bias line from eroding or deteriorating. The top protection layer is preferably formed of an inorganic film such as a silicon nitride film.

According to another aspect of the invention, there is provided a solid-state image pickup device which includes: a substrate; a transistor formed on the substrate; a photoelectric conversion element including a first electrode connected to a drain or a source of the transistor, a semiconductor layer stacked on the first electrode, and a second electrode stacked on the semiconductor layer; an upper insulating film disposed on the second electrode; and a bias line formed on the upper insulating film to be connected to the second electrode, wherein the first electrode is connected to the drain or the source on a lower side than the first electrode, and the bias line and the second electrode are connected to each other via a contact hole formed in the upper insulating film.

According to the configuration, the first electrode is electrically connected to, for example, a drain of the transistor by at least a portion thereof overlapping with the upper surface of the drain. In such a case, the lower insulating film may be formed to be disposed between the drain and the first electrode so that the first electrode overlaps with the upper surface of the drain within a contact hole formed in the lower insulating film. According to the configuration, since it is not necessary to form a contact hole in the insulating layer on the second electrode, for electrically connecting the photoelectric conversion element and the transistor to each other, the photoelectric conversion element can be formed in a larger region, and the sensitivity of the photoelectric conversion element can be increased.

According to a further embodiment of the invention, there is provided a solid-state image pickup device which includes: a substrate; a transistor formed on the substrate; a photoelectric conversion element including a first electrode connected to a drain or a source of the transistor, a semiconductor layer stacked on the first electrode, and a second electrode stacked on the semiconductor layer; and a bias line connected to the second electrode, wherein a lower insulating film is formed between the drain or the source and the first electrode, and wherein the first electrode is electrically connected to the drain or the source by overlapping with an upper surface of the drain or the source within a contact hole formed in the lower insulating film.

In the configuration, the lower insulating film is formed so as to cover the transistor. Owing to such a configuration, the transistor, particularly, a channel region thereof is protected by the lower insulating film from being damaged by an etching process or the like when forming the photoelectric conversion element. An inorganic insulating film may be used as the lower insulating film. Since it is possible to more reliably form the contact hole in the lower insulating film compared with an organic insulating film, the electrical connection between the first electrode and the drain can be carried out in a reliable manner.

In the solid-state image pickup device having such a configuration, the transistor may have a configuration that the gate electrode, the gate insulating film, the semiconductor layer and the drain electrode are formed in this order from a lower side of the substrate toward an upper side thereof, and that it includes a storage capacitor having at least one of the gate insulating film, the lower insulating film and the insulating layer on the second electrode, as a dielectric film thereof.

The solid-state image pickup device of the invention can be applied to a variety of types of electronic apparatuses. For example, a conversion layer such as a phosphorescent material capable of converting radioactive rays into light may be attached to the solid-state image pickup device to thereby form a medical X-ray imaging device, or the solid-state image pickup device may be attached to a display side of a display device of, for example, a liquid crystal display apparatus and an electronic display apparatus or may be formed to be integral with the pixels of the display device to thereby form a display device having input capability.

According to a still another aspect of the invention, there is provided a method of manufacturing a solid-state image pickup device having a transistor and a photoelectric conversion element connected to the transistor, the method including the steps of: forming a transistor; forming a first electrode so as to be connected to a drain or a source of the transistor; forming a semiconductor layer on the first electrode; forming a second electrode on the semiconductor layer; forming an insulating layer containing at least an inorganic film on the second electrode; forming a contact hole in the insulating layer; and forming a bias line on the insulating layer so as to be connected to the second electrode via the contact hole, in which the inorganic film forms the insulating layer so that the insulating layer makes contact with a side surface of the semiconductor layer. When the first electrode is formed, the first electrode is connected to the drain or the source of the transistor. The manufacturing method further includes a step of forming a top protection film on the insulating layer so as to cover the bias line.

According to a still another aspect of the invention, there is provided a method of manufacturing a solid-state image pickup device having a transistor and a photoelectric conversion element connected to the transistor, the method including the steps of: forming a transistor; forming a first electrode so as to be connected to a drain or a source of the transistor; forming a semiconductor layer on the first electrode; forming a second electrode on the semiconductor layer; forming an upper insulating film on the second electrode; forming a contact hole in the upper insulating film; and forming a bias line on the upper insulating film so as to be connected to the second electrode via the contact hole, wherein when the first electrode is formed, the first electrode is connected to the drain or the source on a lower side than the first electrode. The manufacturing method further includes the steps of: forming a lower insulating film on the transistor; and forming a contact hole in the lower insulating film, in which the first electrode is connected to the drain or the source via the contact hole formed in the lower insulating film.

BRIEF DESCRIPTION OF THE DRAWINGS

The invention will be described with reference to the accompanying drawings, wherein like numbers reference like elements.

FIGS. 5A to 5F are cross-sectional views illustrating the process steps of a manufacturing method of the solid-state image pickup device illustrated in FIGS. 4A and 4B.

DESCRIPTION OF EXEMPLARY EMBODIMENTS

Figure 1:
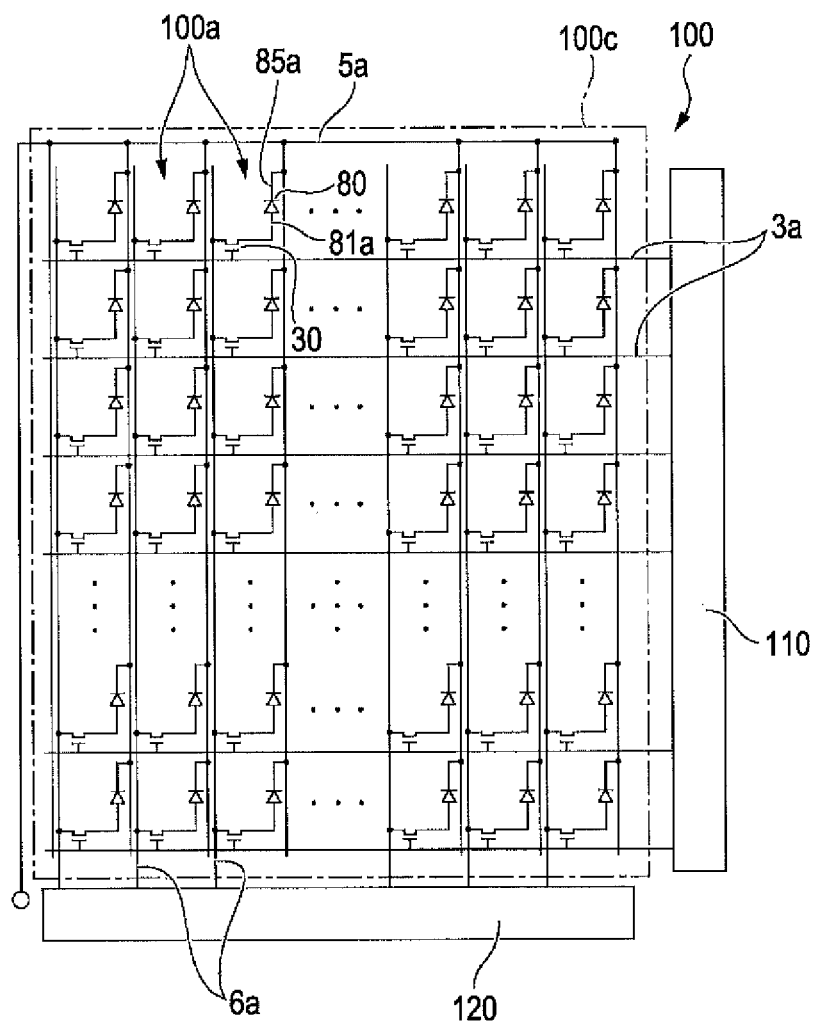
FIG. 1 is a block diagram illustrating an electrical structure of a solid-state image pickup device employing the invention, illustrating a state where a storage capacitor is not yet formed in a pixel.

Hereinafter, exemplary embodiments of the invention will be described with reference to the drawings. In the drawings referenced in the following description, individual layers or individual members are depicted with different reduced scales in order to make them large enough to be recognized on the drawings. Although the source and drain of a field-effect transistor are interchanged depending on a conductivity type thereof or a current-flowing direction, in the invention, for the convenience's sake, it will be assumed that the drain is located on a side to which a photoelectric conversion element is connected and the source is located on a side to which a signal line (a data line) is connected.

Overall Structure

Figure 2A:
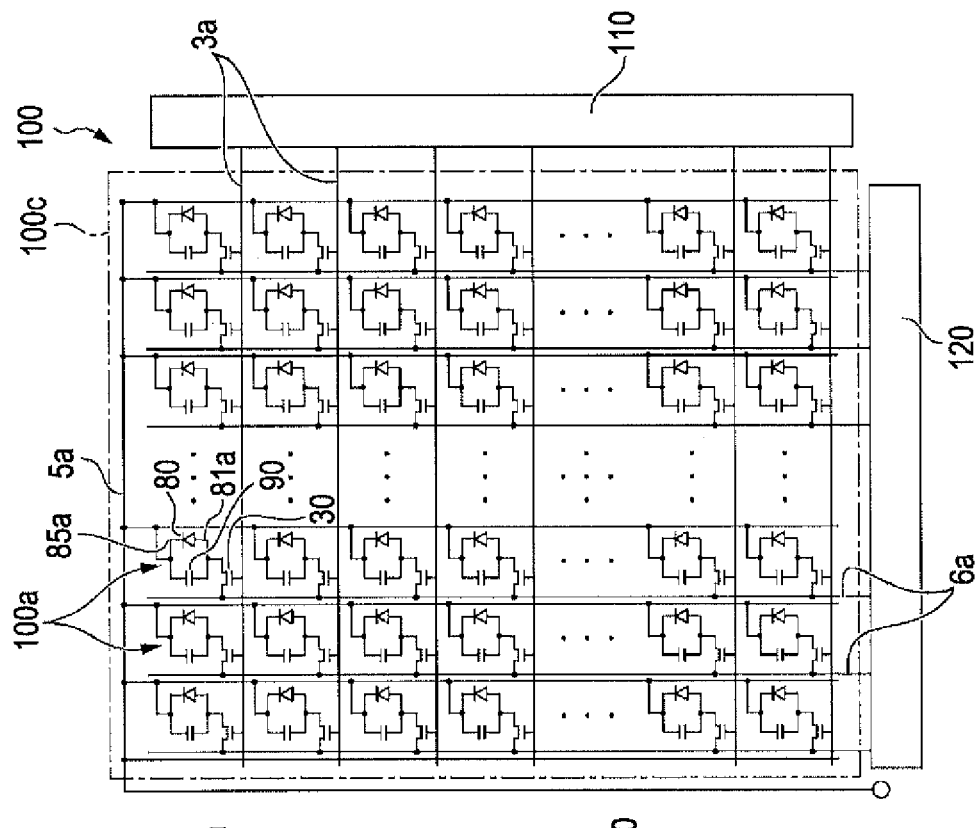
FIGS. 2A and 2B are block diagrams illustrating the electrical structure of the solid-state image pickup device employing the invention, illustrating a state where the storage capacitor is formed in the pixel by using a capacitance line and a state where the storage capacitor is formed in the pixel without using the capacitance line, respectively.
Figure 2B:
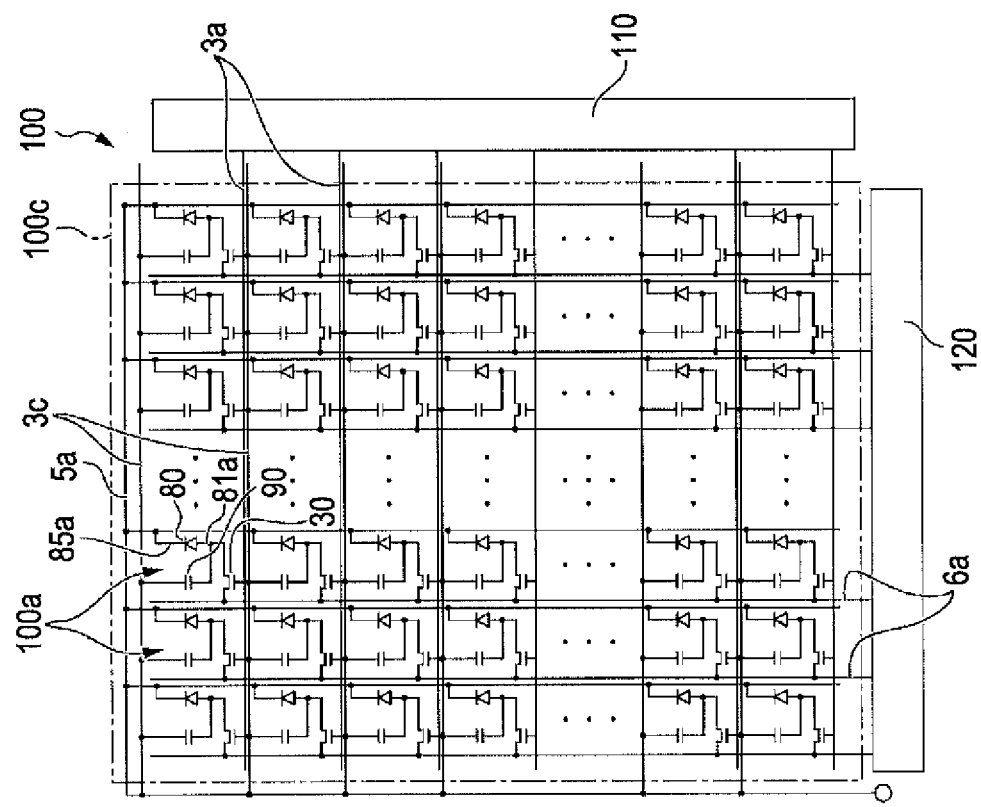
Figure 3:
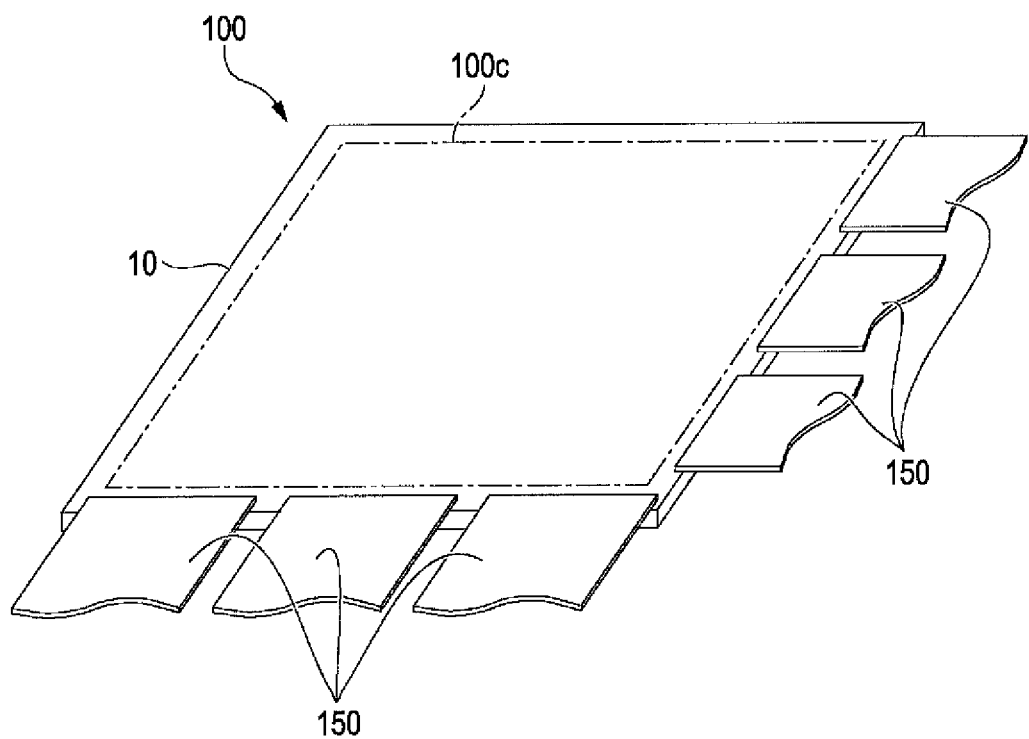
FIG. 3 is an explanatory view schematically illustrating the appearance of the solid-state image pickup device employing the invention.

FIG. 1 is a block diagram illustrating an electrical structure of a solid-state image pickup device employing the invention, illustrating a state where a storage capacitor is not yet formed in a pixel. FIGS. 2A and 2B are block diagrams illustrating the electrical structure of the solid-state image pickup device employing the invention, illustrating a state where the storage capacitor is formed in the pixel by using a capacitance line and a state where the storage capacitor is formed in the pixel without using the capacitance line, respectively. FIG. 3 is an explanatory view schematically illustrating the appearance of the solid-state image pickup device employing the invention.

A solid-state image pickup device 100 illustrated in FIG. 1 includes a plurality of gate lines 3a and a plurality of source lines 6a as signal lines extending in mutually intersecting directions and pixels 100a disposed at positions corresponding the intersections of the gate lines 3a and the source lines 6a. In this manner, an image pickup region 100c is formed by a region in which a plurality of pixels 100a is arranged in a matrix form. In each of the plurality of pixels 100a, a photoelectric conversion element 80 that generates electric charges corresponding to an incident light intensity and a field-effect transistor (transistor) 30 that is electrically connected to the photoelectric conversion element 80 are formed. The photoelectric conversion element 80 is formed of a PIN type photodiode or a PN type photodiode. The gate line 3a is electrically connected to a gate of the field-effect transistor 30, and the source line 6a is electrically connected to a source of the field-effect transistor 30. Moreover, a drain of the field-effect transistor 30 is electrically connected to a first electrode (anode) 81a of the photoelectric conversion element 80. In the present embodiment, a bias line 5a extends to be parallel with the source line 6a, and the bias line 5a is electrically connected to a second electrode (cathode) 85a of the photoelectric conversion element 80. Therefore, a reverse bias is applied to the photoelectric conversion element 80. Furthermore, the bias line 5a may be configured to extend to be parallel with the gate line 3a.

The plurality of gate lines 3a is connected to a gate line driving circuit 110, and the field-effect transistors 30 of the respective pixels 100a are sequentially turned on/off by gate pulses output from the gate line driving circuit 110. The plurality of source lines 6a is connected to a readout circuit 120, and electric signals corresponding to an incident light intensity in the respective pixels 100a are sequentially output to the readout circuit 120 via the source lines 6a in conjunction with the on/off operation of the field-effect transistors 30. The readout circuit 120 is provided with a so-called charge-sensing amplifier which is configured by an operational amplifier and a capacitor. Moreover, constant potential is applied to the bias line 5a.

The solid-state image pickup device 100 may have a structure as illustrated in FIGS. 2A and 2B. Referring to the structure illustrated in FIGS. 2A and 2B, similar to the structure described with reference to FIG. 1, in each of the plurality of pixels 100a, a photoelectric conversion element 80 that generates electric charges corresponding to an incident light intensity and a field-effect transistor 30 that is electrically connected to the photoelectric conversion element 80 are formed, and the photoelectric conversion element 80 is formed of a PIN type photodiode or a PN type photodiode. The gate line 3a is electrically connected to a gate of the field-effect transistor 30, and the source line 6a is electrically connected to a source of the field-effect transistor 30. Moreover, a drain of the field-effect transistor 30 is electrically connected to a first electrode 81a of the photoelectric conversion element 80. Furthermore, a bias line 5a is electrically connected to a second electrode 85a of the photoelectric conversion element 80.

In the solid-state image pickup device 100 illustrated in FIGS. 2A and 2B, a storage capacitor 90 is formed in each of the plurality of pixels 100a, and when the storage capacitors 90 are configured, in the configuration example illustrated in FIG. 2A, a capacitance line 3c is formed so as to extend over the plurality of pixels 100a. In the case of employing the configuration, one electrode of the storage capacitor 90 is electrically connected to the drain of the field-effect transistor 30, and the other electrode of the storage capacitor 90 is electrically connected to the capacitance line 3c. Here, constant potential is applied to the capacitance line 3c, and in the example illustrated in FIG. 2A, since the capacitance line 3c is electrically connected to the bias line 5a, the same potential as the bias line 5a is applied to the capacitance line 3c. In this manner, the storage capacitor 90 and the photoelectric conversion element 80 are electrically connected in parallel.

In the configuration example illustrated in FIG. 2B, when the storage capacitor 90 is configured to each of the plurality of pixels 100a, one electrode of the storage capacitor 90 is electrically connected to the drain of the field-effect transistor 30 in a manner similar to the first electrode 81a of the photoelectric conversion element 80, and the other electrode of the storage capacitor 90 is electrically connected to the bias line 5a in a manner similar to the second electrode 85a of the photoelectric conversion element 80. Therefore, the storage capacitor 90 and the photoelectric conversion element 80 are electrically connected in parallel.

In the solid-state image pickup device 100, the gate line 3a, the source line 6a, the bias line 5a, and the capacitance line 3c, and the pixel 100a (the photoelectric conversion element 80, the field-effect transistor 30, and the storage capacitor 90) described with reference to FIGS. 1, 2A and 2B are formed on a substrate 10 illustrated in FIG. 3. Here, an approximately central region of the substrate 10 is used as the image pickup region 100c in which the pixels 100a are arranged in a matrix form. In the example illustrated in FIG. 3, the gate line driving circuit 110 and the readout circuit 120 are formed, for example, on a driving IC (not illustrated) different from the substrate 10, and a flexible substrate 150 having the driving IC mounted thereon is mounted on the substrate 10.

First Embodiment

Structure

Figure 4A:
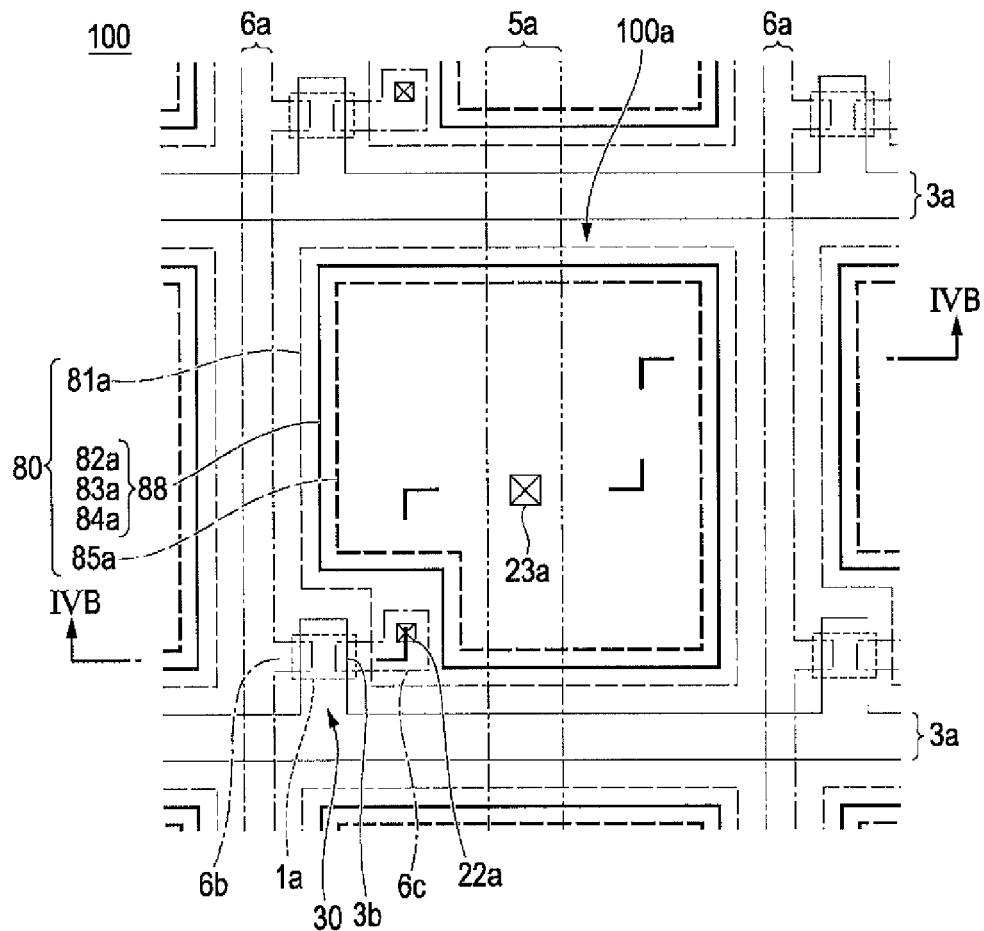
FIGS. 4A and 4B are a top plan view and a cross-sectional view of one pixel of a solid-state image pickup device according to a first embodiment of the invention, respectively.
Figure 4B:
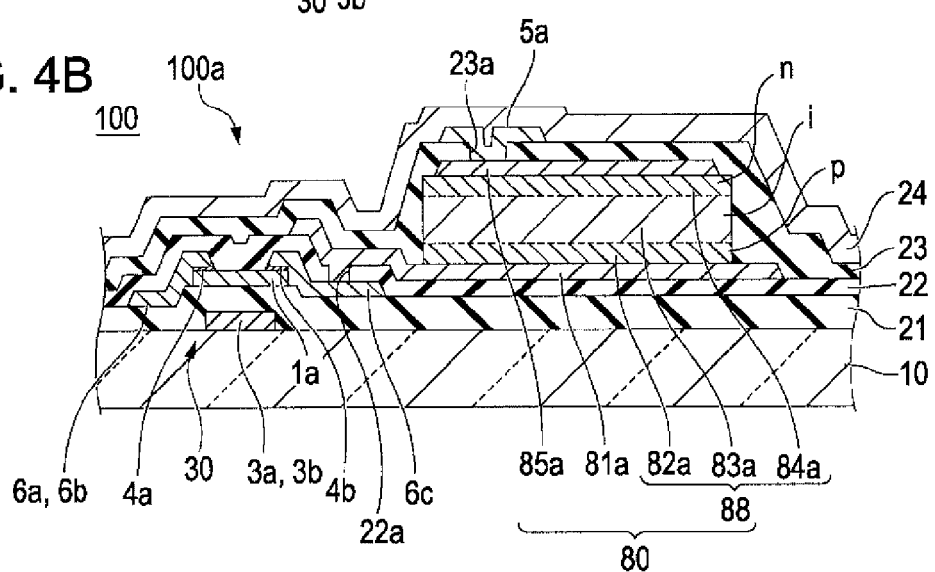

FIGS. 4A and 4B are a top plan view and a cross-sectional view of one of the pixels 100a of the solid-state image pickup device 100 according to a first embodiment of the invention, respectively, in which FIG. 4B is a cross-sectional view of the solid-state image pickup device 100 taken along the lines IVB-IVB in FIG. 4A. In FIG. 4A, the gate lines 3a and thin films or the like formed simultaneously with them are denoted by thin solid lines, the source lines 6a and thin films or the like formed simultaneously with them are denoted by dashed-dotted lines, semiconductor films (active layers) are denoted by thin and short dotted lines, the first electrode 81a of the photoelectric conversion element 80 is denoted by thin and long dotted lines, a semiconductor layer 88 of the photoelectric conversion element 80 is denoted by thick solid lines, and the second electrode 85a of the photoelectric conversion element 80 is denoted by thick and long dotted lines.

As illustrated in FIG. 4A, the gate lines 3a and the source lines 6a extend in mutually intersecting directions on the substrate 10 (FIG. 4B), and the pixel 100a is formed at each of the intersections of the gate lines 3a and the source lines 6a. Moreover, the bias line 5a extends to be parallel with the source lines 6a. In the present embodiment, the gate lines 3a and the source lines 6a extend on regions sandwiched between neighboring pixels 100a, and the bias line 5a is formed so as to cross the center of the pixel 100a.

In the pixel 100a, the photoelectric conversion element 80 formed of a PIN type photodiode and the field-effect transistor 30 electrically connected to the photoelectric conversion element 80 are formed. A gate electrode 3b of the field-effect transistor 30 is formed by a portion of the gate line 3a, and a source electrode 6b of the field-effect transistor 30 is formed by a portion of the source line 6a. A drain electrode 6c of the field-effect transistor 30 is electrically connected to the first electrode 81a of the photoelectric conversion element 80, and the bias line 5a is electrically connected to the second electrode 85a of the photoelectric conversion element 80.

A description of the cross-sectional structure or the like of the pixel 100a will be provided with reference to FIGS. 4A and 4B. In the solid-state image pickup device 100 illustrated in FIGS. 4A and 4B, the base of the substrate 10 is formed of an insulating substrate such as a quartz substrate or a heat-resisting glass substrate, and the field-effect transistor 30 having a bottom-gate structure is formed on top of the substrate 10. In the field-effect transistor 30, the gate electrode 3b formed by a portion of the gate line 3a, a gate insulating film 21, a semiconductor portion 1a formed of an amorphous silicon film, constituting an active layer of the field-effect transistor 30, and contact layers 4a and 4b formed of an amorphous silicon film doped with high-concentration N-type impurities are staked in this order. The source line 6a overlaps as the source electrode 6b with a source-side end portion of the semiconductor portion 1a via the contact layer 4a, and the drain electrode 6c overlaps with a drain-side end portion thereof via the contact layer 4b. The source line 6a and the drain electrode 6c are formed of a simultaneously formed conductive film.

A lower insulating film 22 formed, for example, of a silicon nitride film is formed on a top surface side of the source line 6a and the drain electrode 6c so as to cover the semiconductor portion 1a. The first electrode 81a of the photoelectric conversion element 80 is formed on an upper layer of the lower insulating film 22, and the first electrode 81a is electrically connected to the drain electrode 6c by making contact with an upper surface of the drain electrode 6c within a contact hole 22a formed in the lower insulating film 22. In this way, the first electrode 81a is electrically connected to the drain of the field-effect transistor 30 on a lower side than the first electrode 81a.

A high-concentration P-type semiconductor film 82a, an I-type semiconductor film (intrinsic semiconductor film) 83a, and a high-concentration N-type semiconductor film 84a are stacked on an upper layer of the first electrode 81a, and the second electrode 85a is stacked on an upper layer of the high-concentration N-type semiconductor film 84a. By the first electrode 81a, the semiconductor layer 88 having therein the high-concentration P-type semiconductor film 82a, the I-type semiconductor film 83a and the high-concentration N-type semiconductor film 84a, and the second electrode 85a, the photoelectric conversion element 80 functions as a PIN type photodiode.

On an upper layer side of the photoelectric conversion element 80, an upper insulating film (insulating layer) 23 formed of an inorganic insulating film (inorganic film) such as a silicon nitride film is formed on the entire surface of the image pickup region 100c, and the bias line 5a is formed on an upper layer of the upper insulating film 23. Here, in the upper insulating film 23, a contact hole 23a is formed at a position where the upper insulating film 23 overlaps with the second electrode 85a. Therefore, the bias line 5a is electrically connected to the second electrode 85a by overlapping with the second electrode 85a within the contact hole 23a. Moreover, a top protection layer 24 is formed on an upper layer side of the bias line 5a. When the solid-state image pickup device 100 is used, for example, in medical image diagnosis or non-destructive inspection using radioactive rays such as X rays, a conversion layer for converting radioactive beams into visible light is formed by the top protection layer 24 per se or a phosphorescent material provided on an upper layer of the top protection layer 24.

Manufacturing Method

The structure of the solid-state image pickup device according to the present embodiment will be described in detail while explaining a manufacturing method of the solid-state image pickup device 100 according to the first embodiment of the invention with reference to FIGS. 5A to 5F and FIGS. 6A to 6D. FIGS. 5A to 5F and FIGS. 6A to 6D are cross-sectional views illustrating the process steps of the manufacturing method of the solid-state image pickup device 100 according to the first embodiment of the invention, in which the cross sections correspond to the cross section illustrated in FIG. 4B.

In order to manufacture the solid-state image pickup device 100 of the present embodiment, as described below, a transistor forming process (process steps illustrated in FIGS. 5A to 5D) for forming the field-effect transistor 30, a photoelectric conversion element forming process (process steps illustrated in FIGS. 5F to 6B) for forming the photoelectric conversion element 80, an upper insulating film forming process (process step illustrated in FIG. 6C) for forming the upper insulating film 23, and a bias line forming process (process step illustrated in FIG. 6D) for forming the bias line 5a are performed in this order. When the first electrode 81a of the photoelectric conversion element 80 is formed in the photoelectric conversion element forming process, the contact hole 23a is formed in the upper insulating film 23 at a position where the upper insulating film 23 overlaps with the second electrode 85a of the photoelectric conversion element 80 before performing the bias line forming process of electrically connecting the first electrode 81a to the drain of the field-effect transistor 30.

More specifically, in the transistor forming process, first, a stacked film of a molybdenum film having a thickness of about 50 nm and an aluminum film having a thickness of about 250 nm is formed and then patterned to form a gate electrode 3b (gate line 3a) as illustrated in FIG. 5A. In the patterning, the stacked film is etched by a photolithography technique in a state where a resist mask is formed thereon. Next, a gate insulating film 21 formed of a silicon nitride film having a thickness of about 500 nm is formed. Next, a semiconductor film formed of an amorphous silicon film having a thickness of about 120 nm and a contact layer formed of an amorphous silicon film doped with high-concentration N-type impurities having a thickness of about 50 nm are formed, and the semiconductor film and the contact layer are patterned to form an island-like semiconductor portion 1a and an island-like contact layer 4 as illustrated in FIG. 5B. In the patterning, the semiconductor film and the contact layer are etched by a photolithography technique in a state where a resist mask is formed thereon. Next, a stacked film of a molybdenum film having a thickness of about 50 nm, an aluminum film having a thickness of about 250 nm, and a molybdenum film having a thickness of about 50 nm is formed and then patterned to form a source electrode 6b (source line 6a) and a drain electrode 6c as illustrated in FIG. 5C. In the patterning, the stacked film is etched by a photolithography technique in a state where a resist mask is fanned thereon. Next, as illustrated in FIG. 5D, the contact layer 4 is patterned in a self-aligned manner with respect to the source electrode 6b (source line 6a) and the drain electrode 6c to be divided into contact layers 4a and 4b. In this way, the field-effect transistor 30 is formed. In this case, the field-effect transistor 30 has a so-called channel-etch type structure.

Next, in the lower insulating film forming process, as illustrated in FIG. 5E, a lower insulating film 22 formed of a silicon nitride film having a thickness of about 500 nm is formed, and thereafter, a contact hole 22a is formed in a region of the lower insulating film 22 overlapping with a portion of the drain electrode 6c. In the forming of the contact hole 22a, the lower insulating film 22 is etched by a photolithography technique in a state where a resist mask is formed thereon.

Figure 6A:
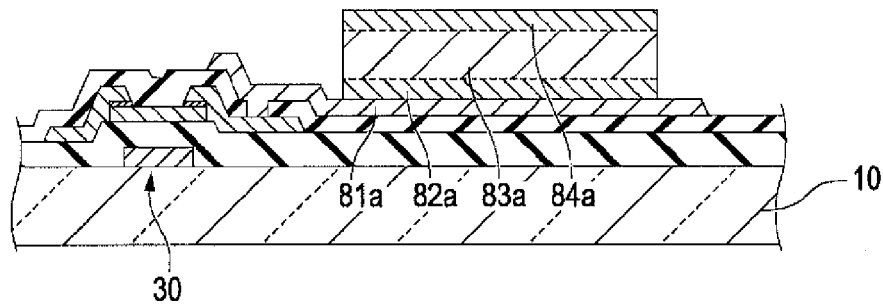
FIGS. 6A to 6D are cross-sectional views illustrating the process steps of the manufacturing method of the solid-state image pickup device illustrated in FIGS. 4A and 4B.
Figure 6B:
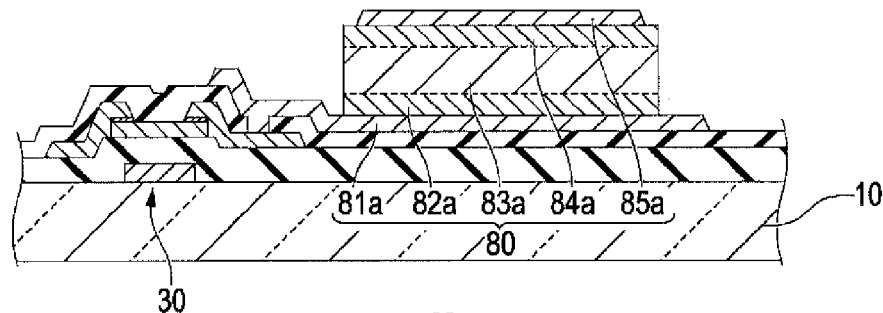

Next, in the photoelectric conversion element forming process, a stacked film of a molybdenum film having a thickness of about 50 nm, an aluminum film having a thickness of about 250 nm, and a molybdenum film having a thickness of about 50 nm is formed and then patterned to form a first electrode 81a of the photoelectric conversion element 80 as illustrated in FIG. 5F. In the patterning, the stacked film is etched by a photolithography technique in a state where a resist mask is formed thereon. As a result, the first electrode 81a is electrically connected to the drain electrode 6c by overlapping with the drain electrode 6c within the contact hole 22a of the lower insulating film 22. Next, a high-concentration P-type semiconductor film, an I-type semiconductor film and a high-concentration N-type semiconductor film are sequentially formed, and thereafter, the high-concentration P-type semiconductor film, the I-type semiconductor film and the high-concentration N-type semiconductor film are patterned to form, on the first electrode 81a, a high-concentration P-type semiconductor film 82a, an I-type semiconductor film 83a and a high-concentration N-type semiconductor film 84a, which are respectively smaller than the first electrode 81a, as illustrated in FIG. 6A. In the patterning, the high-concentration P-type semiconductor film, the I-type semiconductor film and the high-concentration N-type semiconductor film are etched by a photolithography technique in a state where a resist mask is formed thereon. Next, a transparent conductive film such as an ITO film having a thickness of about 50 nm is formed, and thereafter, the transparent conductive film is patterned to form, on an upper layer of the high-concentration N-type semiconductor film 84a, a second electrode 85a of the photoelectric conversion element 80 which is smaller than the high-concentration N-type semiconductor film 84a, as illustrated in FIG. 6B. In the patterning, the transparent conductive film is etched by a photolithography technique in a state where a resist mask is formed thereon. In this way, the photoelectric conversion element 80 configured by a PIN type photodiode is formed. Alternatively, an ITO film may be formed after the high-concentration P-type semiconductor film, the I-type semiconductor film and the high-concentration N-type semiconductor film are sequentially formed, and patterning may be performed using these films as a common mask.

Figure 6C:
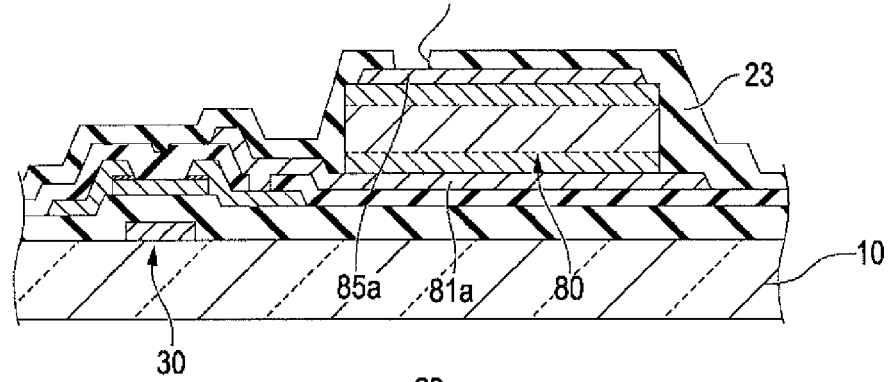

Next, in the upper insulating film forming process, as illustrated in FIG. 6C, an upper insulating film 23 formed of a silicon nitride film having a thickness of about 500 nm is formed, and thereafter, a contact hole 23a is formed in a region of the upper insulating film 23 overlapping with a portion of the second electrode 85a. In the forming of the contact hole 23a, the upper insulating film 23 is etched by a photolithography technique in a state where a resist mask is formed thereon.

Figure 6D:
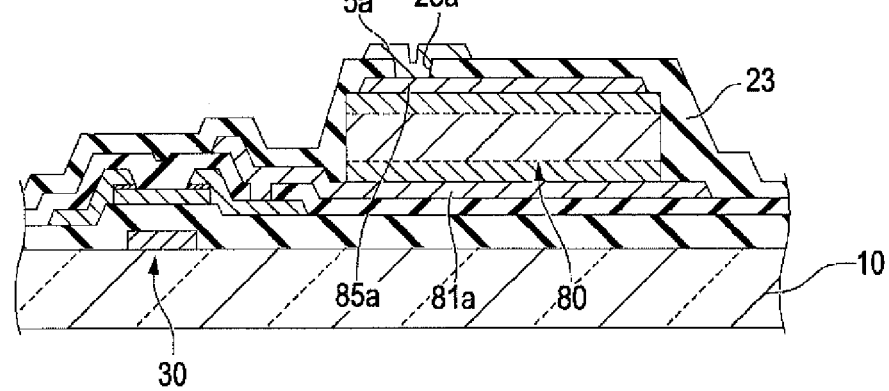

Next, in the bias line foaming process, a stacked film of a molybdenum film having a thickness of about 50 nm, an aluminum film having a thickness of about 250 nm, and a molybdenum film having a thickness of about 50 nm is formed and then patterned to form a bias line 5a as illustrated in FIG. 6D. In the forming of the bias line 5a, the stacked film is etched by a photolithography technique in a state where a resist mask is formed thereon. As a result, the bias line 5a is electrically connected to the second electrode 85a by overlapping with the second electrode 85a within the contact hole 23a of the upper insulating film 23.

Thereafter, as illustrated in FIG. 4B, in the top protection layer forming process, a top protection layer 24 formed of a silicon nitride film having a thickness of about 500 nm is formed. In this way, the solid-state image pickup device 100 is formed.

Major Advantage of the Present Embodiment

As described above, in the present embodiment, when the photoelectric conversion element 80 and the field-effect transistor 30 are electrically connected, the first electrode 81a of the photoelectric conversion element 80 is electrically connected to the drain electrode 6c by overlapping with the drain electrode 6c within the contact hole 22a of the lower insulating film 22 which is formed on a lower side than the first electrode 81a. Therefore, since it is not necessary to form a contact hole in the upper insulating film 23, for electrically connecting the photoelectric conversion element 80 and the field-effect transistor 30 to each other, the number of contact holes to be formed in the upper insulating film 23 can be reduced. Accordingly, the photoelectric conversion element 80 can be formed in a larger region, and the sensitivity of the photoelectric conversion element 80 can be increased. Moreover, since the lower insulating film 22 which is an inorganic film covers the semiconductor portion 1a, it is possible to prevent the semiconductor portion 1a from being etched when patterning the semiconductor layer 88 of the photoelectric conversion element 80.

Moreover, in the present embodiment, when the bias line 5a is electrically connected to the second electrode 85a of the photoelectric conversion element 80, the bias line 5a is electrically connected to the second electrode 85a by overlapping with the second electrode 85a within the contact hole 23a of the upper insulating film 23 which is formed of an inorganic insulating film such as a silicon nitride film. According to such a structure, since the contact hole 23a is formed by etching the upper insulating film 23 (inorganic insulating film) using a photolithography technique in a state where a resist mask is formed thereon, it is possible to reliably form the contact hole 23a at a position where it overlaps with the second electrode 85a. Therefore, it is possible to reliably prevent a situation where an insulating film is unintendedly left on the second electrode 85a, and thus, the electrical connection between the second electrode 85a and the bias line 5a can be carried out in a reliable manner.

Furthermore, in the present embodiment, the upper insulating film 23 is an inorganic insulating film formed of a silicon nitride film which is an inorganic film, and is formed to be in contact with the second electrode 85a and a side surface of the semiconductor layer 88 while covering them. Owing to such a configuration, the second electrode 85a and the semiconductor layer 88 are protected by the inorganic film from coming into contact with moisture or air during or after the manufacturing process such as the process for forming the bias line 5a. Therefore, the photoelectric conversion element 80 is not likely to deteriorate, and thus, the reliability of the solid-state image pickup device 100 can be increased.

Second Embodiment

Figure 7A:
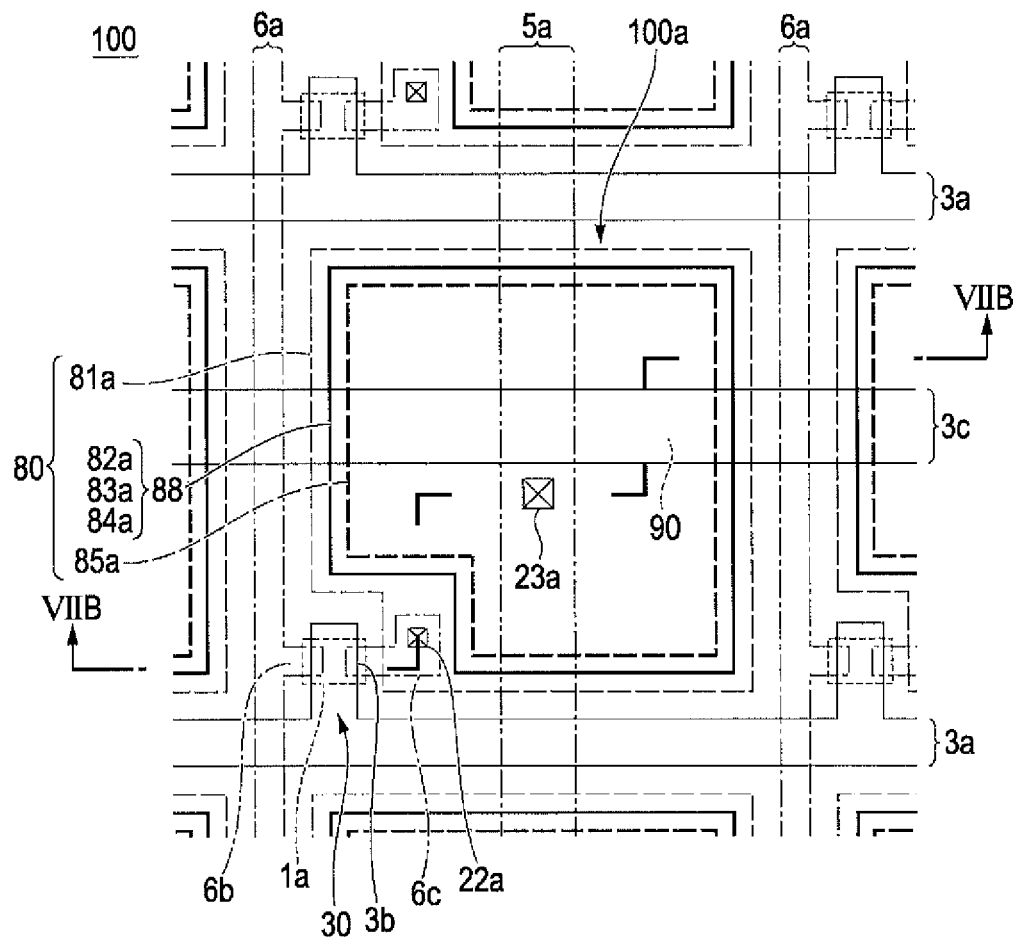
FIGS. 7A and 7B are a top plan view and a cross-sectional view of one pixel of a solid-state image pickup device according to a second embodiment of the invention, respectively.
Figure 7B:
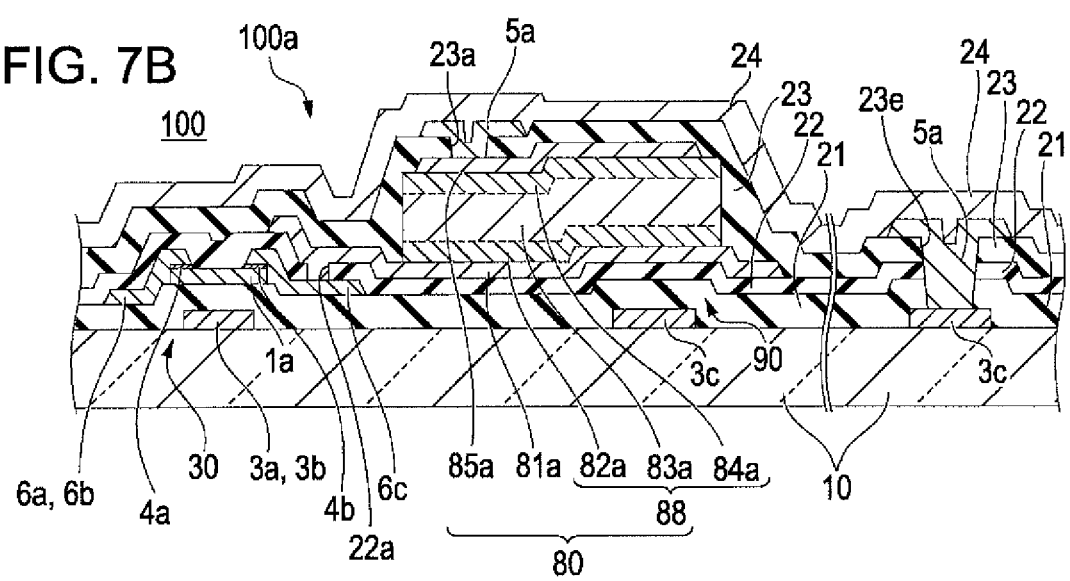

FIGS. 7A and 7B are a top plan view and a cross-sectional view of one of the pixels 100a of a solid-state image pickup device 100 according to a second embodiment of the invention, respectively, in which FIG. 7B is a cross-sectional view of the solid-state image pickup device 100 taken along the lines VIIB-VIIB in FIG. 7A. Since a basic structure of the present embodiment is the same as that of the first embodiment, the same or corresponding portions will be denoted by the same reference numerals, and redundant description thereof will be omitted.

In the solid-state image pickup device 100 illustrated in FIGS. 7A and 7B, similar to the first embodiment, the gate lines 3a and the source lines 6a extend in mutually intersecting directions on the substrate 10, and the pixel 100a is formed at each of the intersections of the gate lines 3a and the source lines 6a. Moreover, the bias line 5a extends to be parallel with the source lines 6a. Furthermore, in the present embodiment, similar to the first embodiment, when the photoelectric conversion element 80 and the field-effect transistor 30 are electrically connected, the first electrode 81a of the photoelectric conversion element 80 is electrically connected to the drain electrode 6c by overlapping with the drain electrode 6c within the contact hole 22a of the lower insulating film 22 which is formed on a lower side than the first electrode 81a. Furthermore, in the present embodiment, similar to the first embodiment, when the bias line 5a is electrically connected to the second electrode 85a of the photoelectric conversion element 80, the bias line 5a is electrically connected to the second electrode 85a by overlapping with the second electrode 85a within the contact hole 23a of the upper insulating film 23 which is formed of an inorganic insulating film such as a silicon nitride film.

As described above with reference to FIG. 2A, the solid-state image pickup device 100 illustrated in FIGS. 7A and 7B is an example in which the storage capacitor 90 is formed using the capacitance line 3c to be electrically connected to be parallel with the photoelectric conversion element 80. Therefore, in the present embodiment, the capacitance line 3c extends to be parallel with the gate line 3a, and the capacitance line 3c is formed so as to cross the center of the pixel 100a. Here, the capacitance line 3c is a conductive film which is formed on a lower layer side of the gate insulating film 21 simultaneously with the gate electrode 3b (gate line 3a), and passes along the lower layer side of the first electrode 81a of the photoelectric conversion element 80. For this reason, the gate insulating film 21 and the lower insulating film 22 are interposed between the capacitance line 3c and the first electrode 81a, and the capacitance line 3c and the first electrode 81a oppose each other via the gate insulating film 21 and the lower insulating film 22. Therefore, the storage capacitor 90 in which the capacitance line 3c is used as a lower electrode, the gate insulating film 21 and the lower insulating film 22 are used as a dielectric film, and the first electrode 81a is used as an upper electrode is formed in the pixel 100a.

Here, as illustrated in FIG. 2A, since the capacitance line 3c is electrically connected to the bias line 5a at an outside of the image pickup region 100c, the storage capacitor 90 and the photoelectric conversion element 80 are electrically connected in parallel. When the connection is carried out, as illustrated in the right end portion of FIG. 7B, the present embodiment employs a structure in which a contact hole 23e is formed in the gate insulating film 21, the lower insulating film 22 and the upper insulating film 23, which are interposed between the capacitance line 3c and the bias line 5a, and the capacitance line 3c and the bias line 5a are electrically connected via the contact hole 23e.

When the solid-state image pickup device 100 having such a structure is manufactured, the capacitance line 3c may be formed simultaneously with the forming of the gate line 3a in the process step illustrated in FIG. 5A. Moreover, in the process step illustrated in FIG. 6C, the contact hole 23e may be formed simultaneously with the forming of the contact hole 23a or in a separate process step.

As described above, in the present embodiment, the first electrode 81a of the photoelectric conversion element 80 is electrically connected to the drain electrode 6c by overlapping with the drain electrode 6c within the contact hole 22a of the lower insulating film 22 which is formed on a lower side than the first electrode 81a. Therefore, since it is not necessary to form a contact hole in the upper insulating film 23, for electrically connecting the photoelectric conversion element 80 and the field-effect transistor 30 to each other, the photoelectric conversion element 80 can be formed in a larger region, and the sensitivity of the photoelectric conversion element 80 can be increased. Moreover, the bias line 5a is electrically connected to the second electrode 85a by overlapping with the second electrode 85a within the contact hole 23a of the upper insulating film 23 which is formed of an inorganic insulating film such as a silicon nitride film. Therefore, unlike the case where an organic insulating film is used as the upper insulating film 23, it is possible to reliably form the contact hole 23a at a position where it overlaps with the second electrode 85a. Accordingly, it is possible to provide the same advantage as the first embodiment that the electrical connection between the second electrode 85a and the bias line 5a can be carried out in a reliable manner.

Furthermore, in the present embodiment, since the lower insulating film 22 is formed of an inorganic insulating film such as a silicon nitride film, the storage capacitor 90 can be formed by using the gate insulating film 21 and the lower insulating film 22 as a dielectric film.

Furthermore, in the present embodiment, since both the lower insulating film 22 and the upper insulating film 23 are formed of an inorganic insulating film such as a silicon nitride film, it is possible to reliably form the contact hole 23e so as to penetrate through the gate insulating film 21, the lower insulating film 22 and the upper insulating film 23. Accordingly, the electrical connection between the capacitance line 3c and the bias line 5a can be carried out in a reliable manner.

Modified Embodiment of Second Embodiment

Figure 8A:
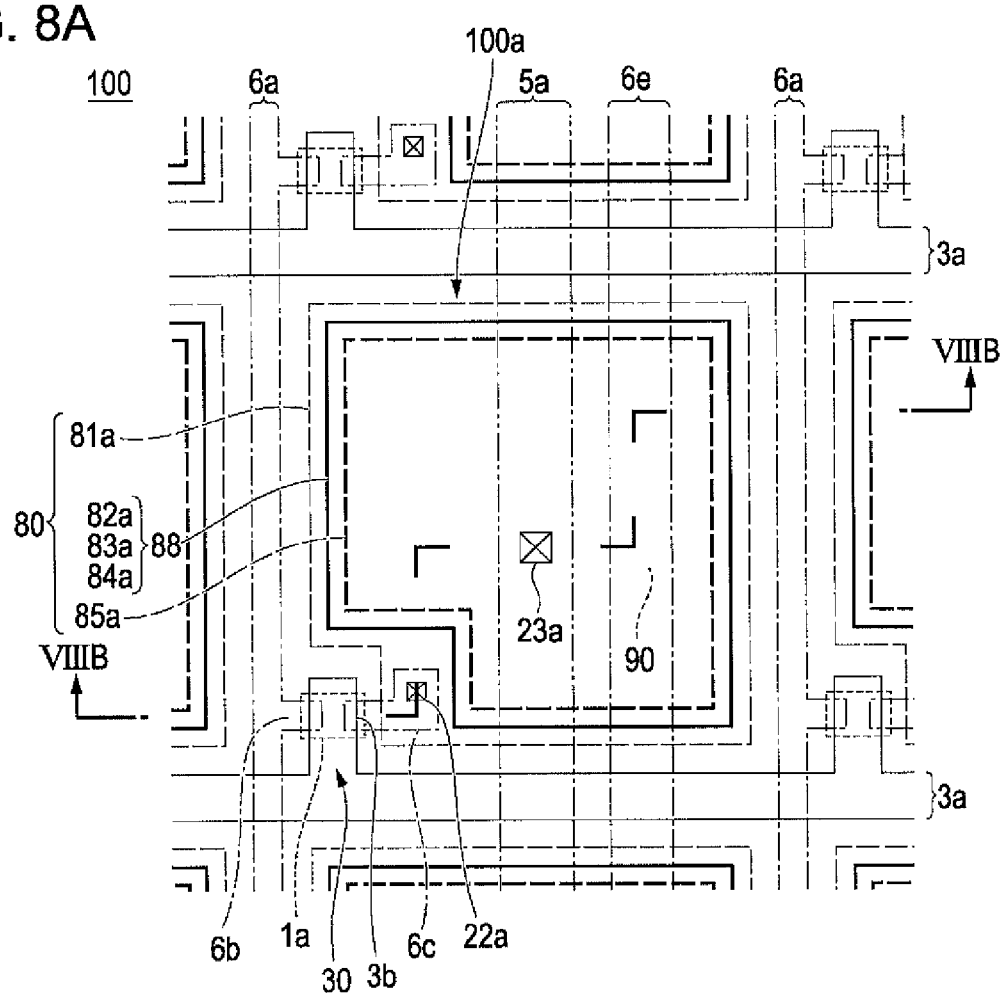
FIGS. 8A and 8B are a top plan view and a cross-sectional view of one pixel of a solid-state image pickup device according to a modified embodiment of the second embodiment of the invention, respectively.
Figure 8B:
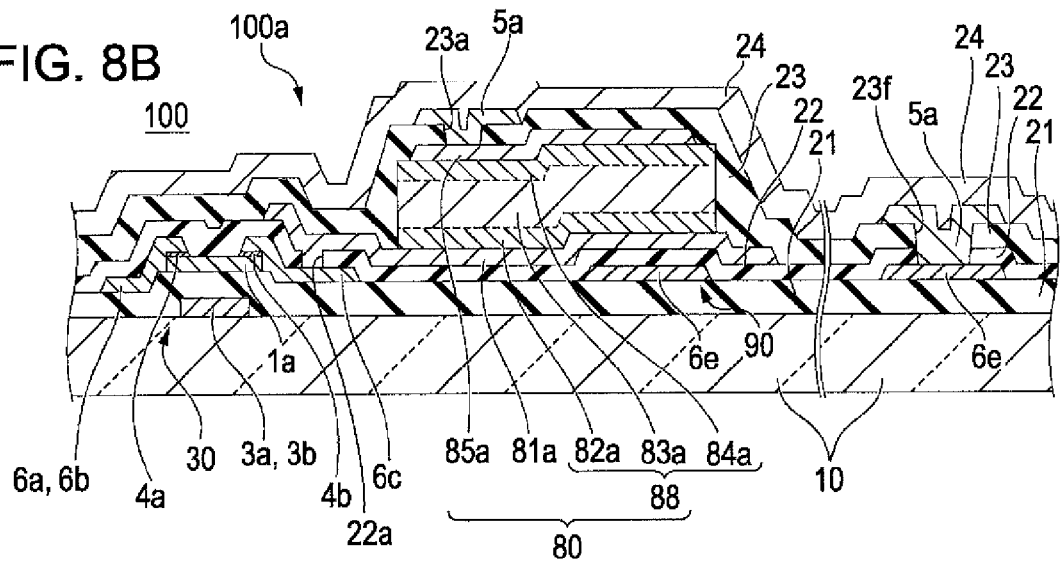

FIGS. 8A and 8B are a top plan view and a cross-sectional view of one of the pixels 100a of a solid-state image pickup device 100 according to a modified embodiment of the second embodiment of the invention, respectively, in which FIG. 8B is a cross-sectional view of the solid-state image pickup device 100 taken along the lines VIIIB-VIIIB in FIG. 8A. Since a basic structure of the present embodiment is the same as that of the first and second embodiments, the same or corresponding portions will be denoted by the same reference numerals, and redundant description thereof will be omitted.

Although similar to the second embodiment, the solid-state image pickup device 100 illustrated in FIGS. 8A and 8B is an example in which the storage capacitor 90 is formed using the capacitance line to be electrically connected to be parallel with the photoelectric conversion element 80, in the present embodiment, the capacitance line 6e is fanned simultaneously with the source line 6a. Therefore, in the present embodiment, the capacitance line 6e is formed so as to cross the center of the pixel 100a to be parallel with the source line 6a.

When the capacitance line 6e is configured, although in the second embodiment, the capacitance line 6e is formed on a lower side than the gate insulating film 21 simultaneously with the gate electrode 3b (gate line 3a), in the present embodiment, the capacitance line 6e is formed simultaneously with the source electrode 6b (source line 6a) and the drain electrode 6c to be disposed between the gate insulating film 21 and the lower insulating film 22 so as to pass along the lower side of the first electrode 81a of the photoelectric conversion element 80. Owing to such a configuration, the lower insulating film 22 is interposed between the capacitance line 6e and the first electrode 81a, and the capacitance line 6e and the first electrode 81a oppose each other via the lower insulating film 22. Therefore, the storage capacitor 90 in which the capacitance line 6c is used as a lower electrode, the lower insulating film 22 is used as a dielectric film, and the first electrode 81a is used as an upper electrode is formed in the pixel 100a.

Moreover, in the present embodiment, similar to the second embodiment, since the capacitance line 6e is electrically connected to the bias line 5a at an outside of the image pickup region 100c, the storage capacitor 90 and the photoelectric conversion element 80 are electrically connected in parallel. When the connection is carried out, as illustrated in the right end portion of FIG. 8B, the present embodiment employs a structure in which a contact hole 23f is formed in the lower insulating film 22 and the upper insulating film 23, which are interposed between the capacitance line 6e and the bias line 5a, and the capacitance line 6e and the bias line 5a are electrically connected via the contact hole 23f.

When the solid-state image pickup device 100 having such a structure is manufactured, the capacitance line 6e may be formed simultaneously with the forming of the source line 6a in the process step illustrated in FIG. 5C. Moreover, the contact hole 23f may be formed through the process step illustrated in FIG. 5E or the process step illustrated in FIG. 6C.

Even when such a structure is employed, the first electrode 81a of the photoelectric conversion element 80 is electrically connected to the drain electrode 6c by overlapping with the drain electrode 6c within the contact hole 22a of the lower insulating film 22 which is formed on a lower side than the first electrode 81a. Therefore, since it is not necessary to form a contact hole in the upper insulating film 23, for electrically connecting the photoelectric conversion element 80 and the field-effect transistor 30 to each other, the photoelectric conversion element 80 can be formed in a larger region, and the sensitivity of the photoelectric conversion element 80 can be increased. Moreover, the bias line 5a is electrically connected to the second electrode 85a by overlapping with the second electrode 85a within the contact hole 23a of the upper insulating film 23 which is formed of an inorganic insulating film such as a silicon nitride film. Therefore, unlike the case where an organic insulating film is used as the upper insulating film 23, it is possible to reliably form the contact hole 23a at a position where it overlaps with the second electrode 85a. Accordingly, it is possible to provide the same advantage as the first and second embodiments that the electrical connection between the second electrode 85a and the bias line 5a can be carried out in a reliable manner.

Furthermore, in the present embodiment, since the lower insulating film 22 is formed of an inorganic insulating film such as a silicon nitride film, the dielectric film of the storage capacitor 90 contains only the lower insulating film 22 but not the gate insulating film 21. For this reason, it is possible to provide an advantage that the capacitance per unit area of the storage capacitor 90 can be increased compared with the second embodiment.

Furthermore, in the present embodiment, since both the lower insulating film 22 and the upper insulating film 23 are formed of an inorganic insulating film such as a silicon nitride film, it is possible to reliably form the contact hole 23f so as to penetrate through the gate insulating film 21, the lower insulating film 22 and the upper insulating film 23. Accordingly, it is possible to provide the same advantage as the second embodiment that the electrical connection between the capacitance line 6e and the bias line 5a can be carried out in a reliable manner. In addition, when the electrical connection between the capacitance line 6e and the bias line 5a is carried out, since the contact hole 23f may be formed by connecting a hole formed in the lower insulating film 22 simultaneously with the contact hole 22a to be continuous with a hole formed in the upper insulating film 23 simultaneously with the contact hole 23a, it is possible to provide an advantage that the contact hole 23f can be formed in an easy manner.

Third Embodiment

Figure 9A:
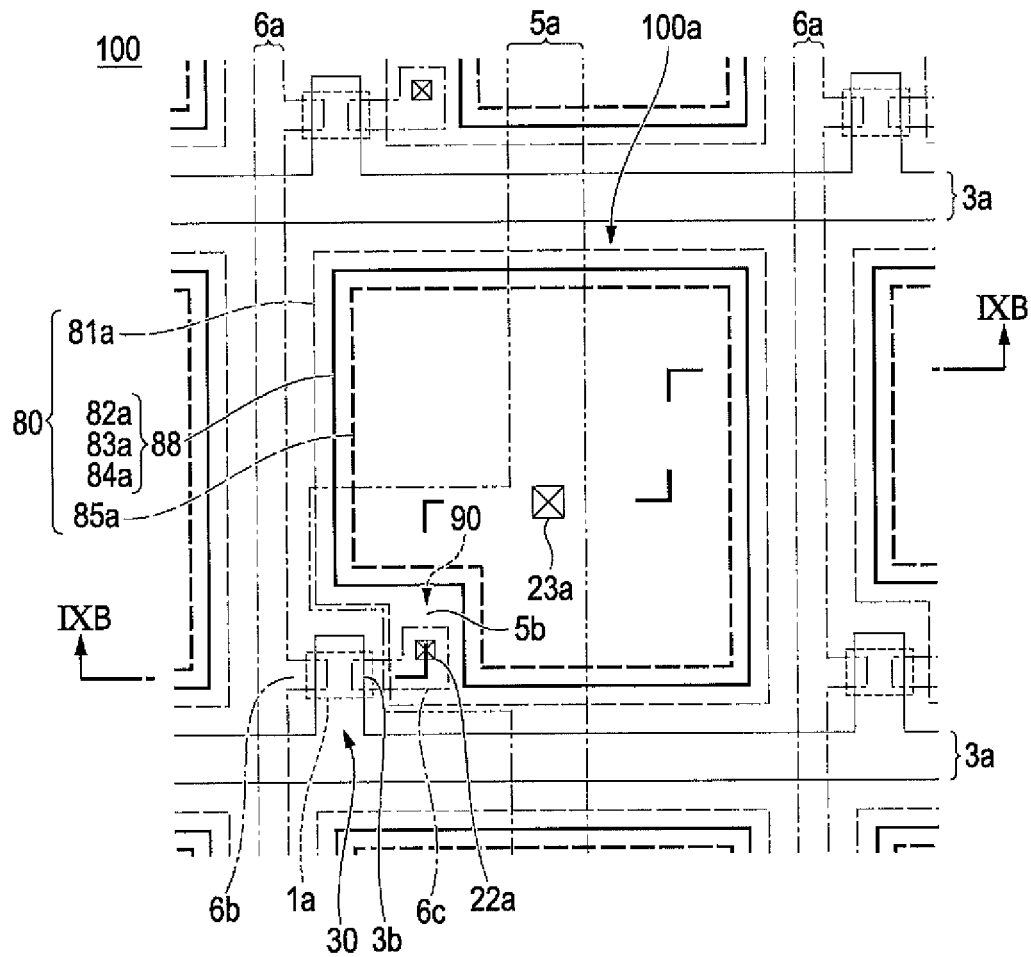
FIGS. 9A and 9B are a top plan view and a cross-sectional view of one pixel of a solid-state image pickup device according to a third embodiment of the invention, respectively.
Figure 9B:
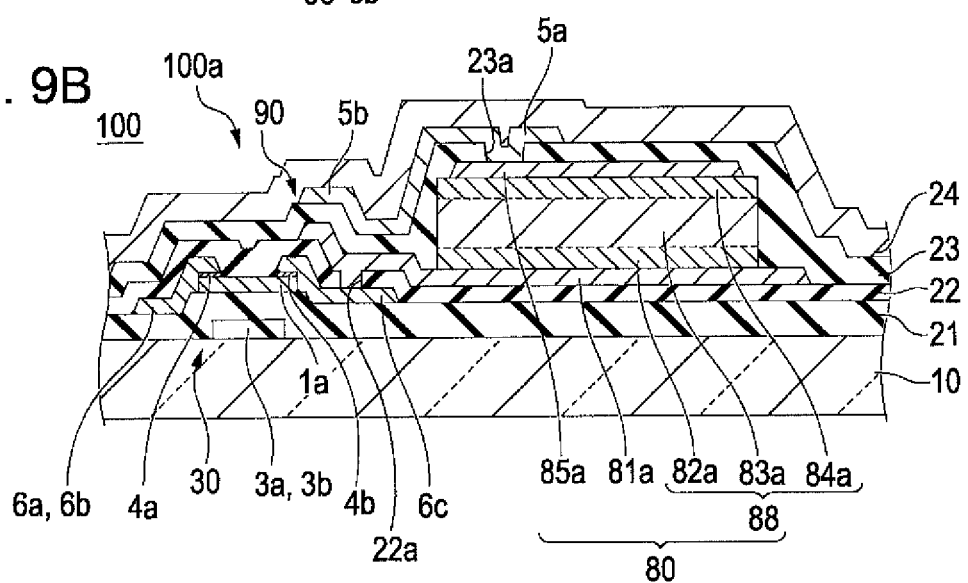

FIGS. 9A and 9B are a top plan view and a cross-sectional view of one of the pixels 100a of a solid-state image pickup device 100 according to a third embodiment of the invention, respectively, in which FIG. 9B is a cross-sectional view of the solid-state image pickup device 100 taken along the lines IXA4-IXA4' in FIG. 9A. Since a basic structure of the present embodiment is the same as that of the first and second embodiments, the same or corresponding portions will be denoted by the same reference numerals, and redundant description thereof will be omitted.

In the solid-state image pickup device 100 illustrated in FIGS. 9A and 9B, similar to the first embodiment, the gate lines 3a and the source lines 6a extend in mutually intersecting directions on the substrate 10, and the pixel 100a is formed at each of the intersections of the gate lines 3a and the source lines 6a. Moreover, the bias line 5a extends to be parallel with the source lines 6a. Furthermore, in the present embodiment, similar to the first embodiment, when the photoelectric conversion element 80 and the field-effect transistor 30 are electrically connected, the first electrode 81a of the photoelectric conversion element 80 is electrically connected to the drain electrode 6c by overlapping with the drain electrode 6c within the contact hole 22a of the lower insulating film 22 which is formed on a lower side than the first electrode 81a. Furthermore, in the present embodiment, similar to the first embodiment, when the bias line 5a is electrically connected to the second electrode 85a of the photoelectric conversion element 80, the bias line 5a is electrically connected to the second electrode 85a by overlapping with the second electrode 85a within the contact hole 23a of the upper insulating film 23 which is formed of an inorganic insulating film such as a silicon nitride film.

Although as described above with reference to FIG. 2B, the solid-state image pickup device 100 illustrated in FIGS. 9A and 9B is an example in which the storage capacitor 90 is formed to be electrically connected to be parallel with the photoelectric conversion element 80, the capacitance line 3c or 6e is not used unlike the second embodiment and the modified embodiment thereof. That is, in the present embodiment, a portion of the bias line 5a is pulled out to a region overlapping with a region of the forming region of the first electrode 81a pulled out from an end portion of respective one of the high-concentration P-type semiconductor film 82a, the I-type semiconductor film 83a, the high-concentration N-type semiconductor film 84a, and the second electrode 85a, which constitute the photoelectric conversion element (PIN type photodiode) 80. For this reason, the upper insulating film 23 is interposed between a pull-out region 5b of the bias line 5a and the end portion of the first electrode 81a, and the pull-out region 5b of the bias line 5a and the end portion of the first electrode 81a oppose each other via the upper insulating film 23. Therefore, the storage capacitor 90 in which the end portion of the first electrode 81a is used as a lower electrode, the upper insulating film 23 is used as a dielectric film, and the pull-out region 5b of the bias line 5a is used as an upper electrode is formed in the pixel 100a, and the storage capacitor 90 is electrically connected in parallel with the photoelectric conversion element 80.

The solid-state image pickup device 100 having such a structure can be formed through the same process steps as the first embodiment, and redundant description thereof will be omitted.

As described above, in the present embodiment, the first electrode 81a of the photoelectric conversion element 80 is electrically connected to the drain electrode 6c by overlapping with the drain electrode 6c within the contact hole 22a of the lower insulating film 22 which is formed on a lower side than the first electrode 81a. Therefore, since it is not necessary to form a contact hole in the upper insulating film 23, for electrically connecting the photoelectric conversion element 80 and the field-effect transistor 30 to each other, the photoelectric conversion element 80 can be formed in a larger region, and the sensitivity of the photoelectric conversion element 80 can be increased. Moreover, the bias line 5a is electrically connected to the second electrode 85a by overlapping with the second electrode 85a within the contact hole 23a of the upper insulating film 23 which is formed of an inorganic insulating film such as a silicon nitride film. Therefore, unlike the case where an organic insulating film is used as the upper insulating film 23, it is possible to reliably form the contact hole 23a at a position where it overlaps with the second electrode 85a. Accordingly, it is possible to provide the same advantage as the first embodiment that the electrical connection between the second electrode 85a and the bias line 5a can be carried out in a reliable manner.

Moreover, since the storage capacitor 90 is formed by using the upper insulating film 23 formed of an inorganic insulating film such as a silicon nitride film as the dielectric film, the end portion of the first electrode 81a as the lower electrode, and the pull-out region 5b of the bias line 5a as the upper electrode, it is possible to provide an advantage that the storage capacitor 90 can be formed in an affirmative manner with substantially the same structure as the first embodiment without using the capacitance line.

Fourth Embodiment

Figure 10:
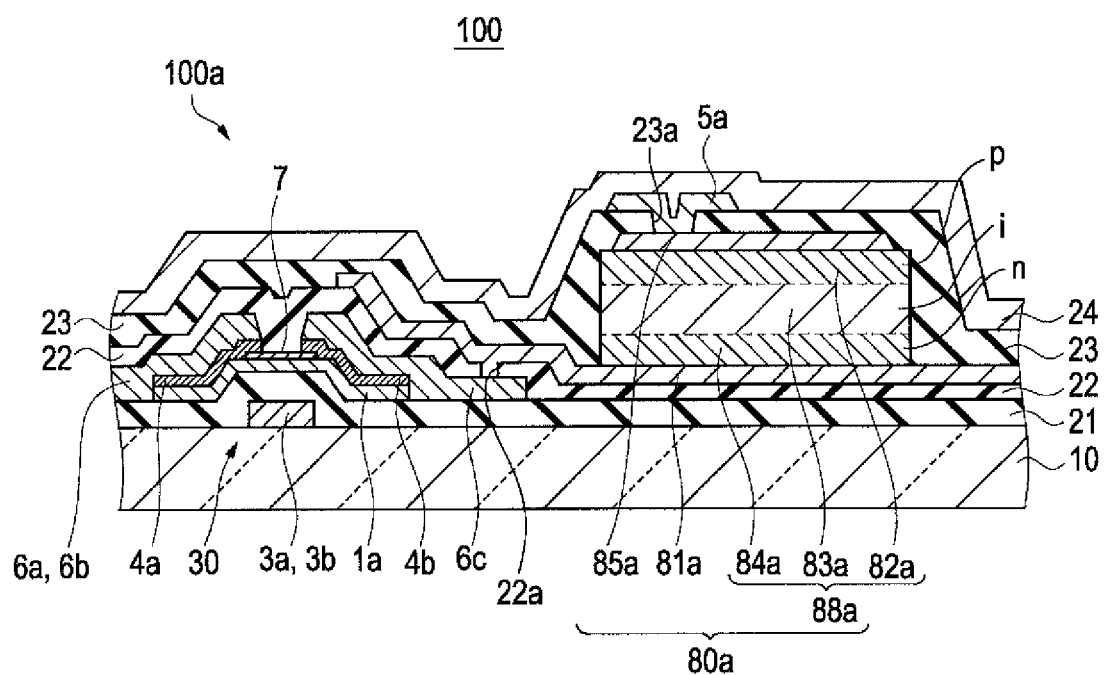
FIG. 10 is a cross-sectional view of one pixel of a solid-state image pickup device according to a fourth embodiment of the invention.

FIG. 10 is a cross-sectional view of one pixel of a solid-state image pickup device according to a fourth embodiment of the invention, illustrating the same cross section taken at the same position as FIG. 4B. The structure of the present embodiment is different from that of the first to third embodiments, in that the channel-etch type field-effect transistor 30 in the first to third embodiments is replaced with a channel-stopper type field-effect transistor 30a, and that the photoelectric conversion element 80 in the first to third embodiments is replaced with a photoelectric conversion element 80a having a semiconductor layer 88a having a different stacking order than that of the semiconductor layer 88 of the photoelectric conversion element 80. Therefore, the same or corresponding portions other than these components will be denoted by the same reference numerals, and redundant description thereof will be omitted. In FIG. 10, the storage capacitor 90 is not illustrated.

As illustrated in FIG. 10, the solid-state image pickup device 100 has the field-effect transistor 30a formed on the substrate 10. In the field-effect transistor 30a, the gate electrode 3b formed by a portion of the gate line 3a, a gate insulating film 21, a semiconductor portion 1a formed of an amorphous silicon film, and a channel protection layer 7 formed of a silicon nitride film are staked in this order. On both sides of the channel protection layer 7, contact layers 4a and 4b doped with high-concentration N-type impurities are stacked on the semiconductor portion 1a. Moreover, the source line 6a overlaps as the source electrode 6b with the contact layer 4a, and the drain electrode 6c overlaps with the contact layer 4b.

A lower insulating film 22 formed, for example, of a silicon nitride film is formed on a top surface side of the source line 6a and the drain electrode 6c so as to cover the semiconductor portion 1a. The first electrode 81a of the photoelectric conversion element 80a is formed on an upper layer of the lower insulating film 22, and the first electrode 81a is electrically connected to the drain electrode 6c by making contact with an upper surface of the drain electrode 6c within a contact hole 22a formed in the lower insulating film 22. In this way, the first electrode 81a is electrically connected to the drain of the field-effect transistor 30a on a lower side than the first electrode 81a.

Moreover, a semiconductor layer 88a on which a high-concentration N-type semiconductor film 84a, an I-type semiconductor film 83a, and a high-concentration P-type semiconductor film 82a are stacked in this order, and the second electrode 85a stacked on an upper layer of the high-concentration P-type semiconductor film 82a are formed on an upper layer of the first electrode 81a. By the first electrode 81a, the semiconductor layer 88a having therein the high-concentration N-type semiconductor film 84a, the I-type semiconductor film 83a and the high-concentration P-type semiconductor film 82a, and the second electrode 85a, the photoelectric conversion element 80a is formed.

On an upper layer side of the photoelectric conversion element 80a, an upper insulating film 23 formed of an inorganic insulating film such as a silicon nitride film is formed on the entire surface of the image pickup region 100c so as to be in contact with the second electrode 85a and a side surface of the semiconductor layer 88a and cover the second electrode 85a and the side surface of the semiconductor layer 88a. Moreover, the bias line 5a is formed on an upper layer of the upper insulating film 23. Here, in the upper insulating film 23, a contact hole 23a is formed at a position where the upper insulating film 23 overlaps with the second electrode 85a. Therefore, the bias line 5a is electrically connected to the second electrode 85a by overlapping with the second electrode 85a within the contact hole 23a. Moreover, a top protection layer 24 is formed on an upper layer side of the bias line 5a.

Figure 11:
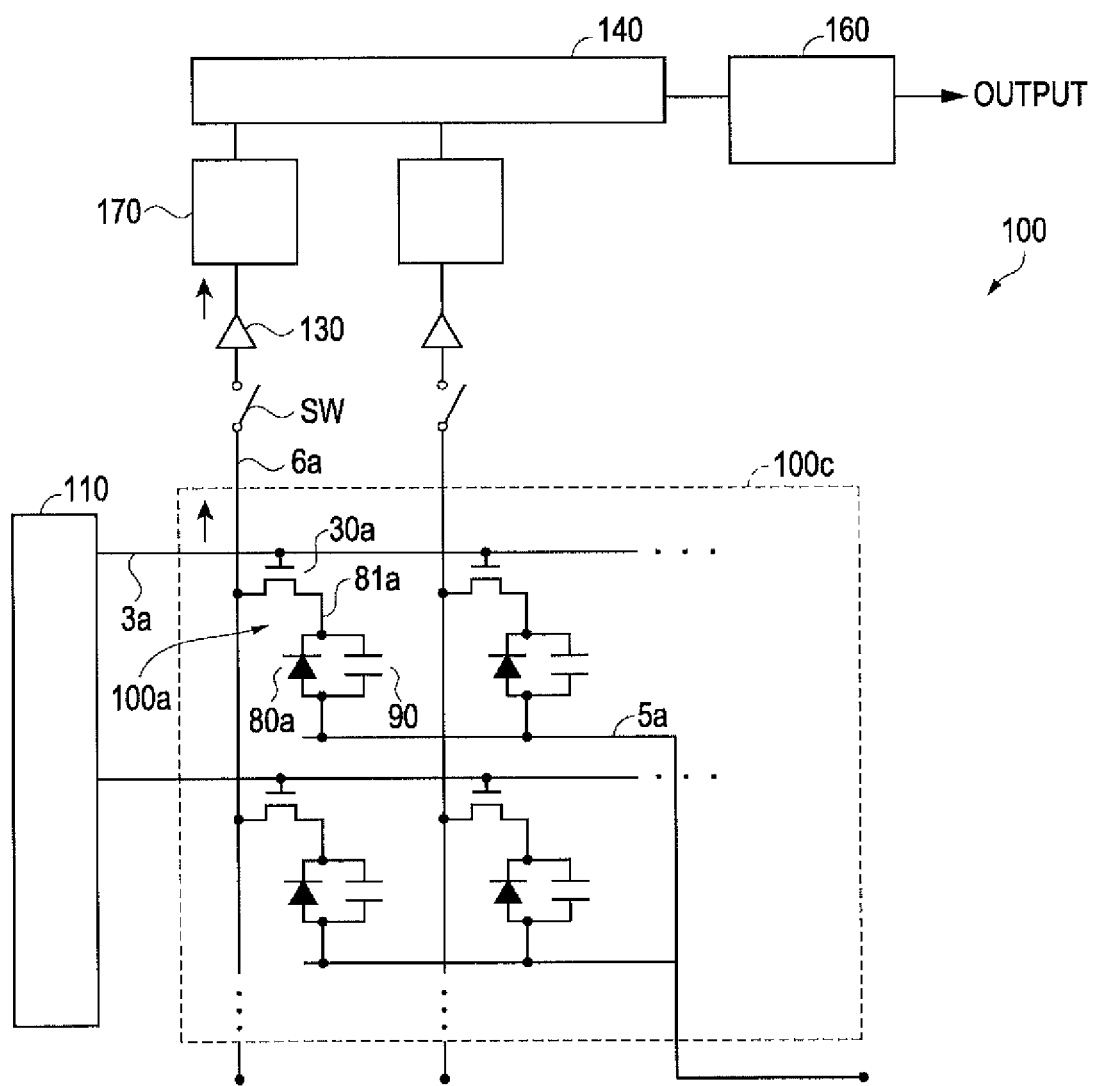
FIG. 11 is a block diagram illustrating an electrical structure of the solid-state image pickup device illustrated in FIG. 10.

In this case, as illustrated in FIG. 11, in the solid-state image pickup device 100, the connection direction of the photoelectric conversion element 80a is opposite to that of the photoelectric conversion element 80 in the block diagram of FIG. 2B, and the photoelectric conversion element 80a and the storage capacitor 90 are electrically connected in parallel. Such a solid-state image pickup device 100 is a so-called passive pixel-type image pickup device capable of outputting electrical signals with improved S/N ratio to the source line 6a while having a simple structure owing to the photoelectric conversion element 80a, the field-effect transistor 30a and the storage capacitor 90. According to this type, electric charges generated by photoelectric conversion in the respective pixels 100a and stored in the photoelectric conversion element 80a and the storage capacitor 90 are output to a readout amplifier 130 as analog electrical signals via the source line 6a when the field-effect transistors 30a are sequentially turned on by a shift register circuit, for example. The electrical signals are amplified by the readout amplifier 130, sampled and held for predetermined period by a sample-and-hold circuit 170, and then, output to a multiplexer circuit 140, whereby the analog signals are serialized. Then, the serialized electrical signals are digitalized to video signals of more than 12 to 16 bits by an AD converter 160 and transferred (output) as data to an image processing apparatus or the like.

Here, the electrical signals in the readout amplifier 130 contain noise components generating in the paths between the pixels 100a and the readout amplifier 130, and thus, it is not desirable to amplify the electrical signals as they are. Therefore, a correlated double sampling circuit is provided in the readout amplifier 130 so that the noise components are separately read out from the readout amplifier 130 to be cancelled. In this way, electrical signals with improved S/N ratio are output to the sample-and-hold circuit 170. Moreover, the solid-state image pickup device 100 according to the first to third embodiments is also a passive pixel-type image pickup device.

As described above, in the present embodiment, the first electrode 81a of the photoelectric conversion element 80a is electrically connected to the drain electrode 6c by overlapping with the drain electrode 6c within the contact hole 22a of the lower insulating film 22 which is formed on a lower side than the first electrode 81a. Therefore, since it is not necessary to form a contact hole in the upper insulating film 23, for electrically connecting the photoelectric conversion element 80a and the field-effect transistor 30a to each other, the photoelectric conversion element 80a can be formed in a larger region, and the sensitivity of the photoelectric conversion element 80a can be increased. Moreover, the bias line 5a is electrically connected to the second electrode 85a by overlapping with the second electrode 85a within the contact hole 23a of the upper insulating film 23 which is formed of an inorganic insulating film such as a silicon nitride film. Therefore, unlike the case where an organic insulating film is used as the upper insulating film 23, it is possible to reliably form the contact hole 23a at a position where it overlaps with the second electrode 85a. Accordingly, it is possible to provide the same advantage as the first to third embodiments that the electrical connection between the second electrode 85a and the bias line 5a can be carried out in a reliable manner.

Moreover, owing to the channel protection layer 7 formed on the semiconductor portion 1a in addition to the lower insulating film 22, it is possible to protect the semiconductor portion 1a from etching or the like when forming the semiconductor layer 88a. Therefore, the lower insulating film 22 can be formed with a smaller thickness.

Furthermore, the second electrode 85a and the semiconductor layer 88 are protected by the inorganic film of the upper insulating film 23 from coming into contact with moisture or air during or after the manufacturing process such as the process for forming the bias line 5a, and are not likely to deteriorate. The solid-state image pickup device 100 having such a configuration is able to provide the same advantage as the first to third embodiments.

Other Embodiment

The solid-state image pickup device 100 is not limited to the above-described embodiments, and substantially the same advantage can be provided by the later-described modified embodiment.

Although in the first to fourth embodiments, a PIN type photodiode is used as the photoelectric conversion element 80 or 80a, a PN type photodiode may be used.

Moreover, although description has been made for an example where a TFT using an amorphous silicon film is used as the field-effect transistor 30 or 30a, a TFT using a polysilicon film or a mono-crystalline silicon layer may be used as the field-effect transistor 30 or 30a.

Although in the first to fourth embodiments, the drain electrode 6c and the first electrode 81a are formed separately, the first electrode 81a may be configured to serve as the drain electrode.

Although in the first, second and fourth embodiments, the first electrode 81a has been used as an electrode of the storage capacitor 90, an extension portion of the drain electrode 6c may be used as an electrode for electrically connecting the storage capacitor 90 to the first electrode 81a.

Although in the third embodiment, a portion of the bias line 5a has been used as an electrode of the storage capacitor 90, a portion of the second electrode 85a or a conductive film formed simultaneously with the second electrode 85a may be used as an electrode of the storage capacitor 90.

In addition, although in the first to third embodiments, description has been made for an example where the P-type semiconductor film, the I-type semiconductor film and the N-type semiconductor film are stacked in this order from the side of the first electrode 81a, the anode of the photoelectric conversion element 80 is electrically connected to the drain of the channel-etch type field-effect transistor 30, and the cathode of the photoelectric conversion element 80 is electrically connected to the bias line 5a, as long as a reverse bias is applied to the photoelectric conversion element 80, a configuration may be used in which the N-type semiconductor film, the I-type semiconductor film and the P-type semiconductor film are stacked in this order from the side of the first electrode 81a, the cathode of the photoelectric conversion element 80 is electrically connected to the drain of the channel-etch type field-effect transistor 30, and the anode of the photoelectric conversion element 80 is electrically connected to the bias line 5a.

Furthermore, although in the fourth embodiment, description has been made for an example where the N-type semiconductor film, the I-type semiconductor film and the P-type semiconductor film are stacked in this order from the side of the first electrode 81a, the cathode of the photoelectric conversion element 80 is electrically connected to the drain of the channel-stopper type field-effect transistor 30a, and the anode of the photoelectric conversion element 80 is electrically connected to the bias line 5a, a configuration may be used in which the P-type semiconductor film, the I-type semiconductor film and the N-type semiconductor film are stacked in this order from the side of the first electrode 81a, the anode of the photoelectric conversion element 80 is electrically connected to the drain of the channel-stopper type field-effect transistor 30, and the cathode of the photoelectric conversion element 80 is electrically connected to the bias line 5a.

Figure 12:
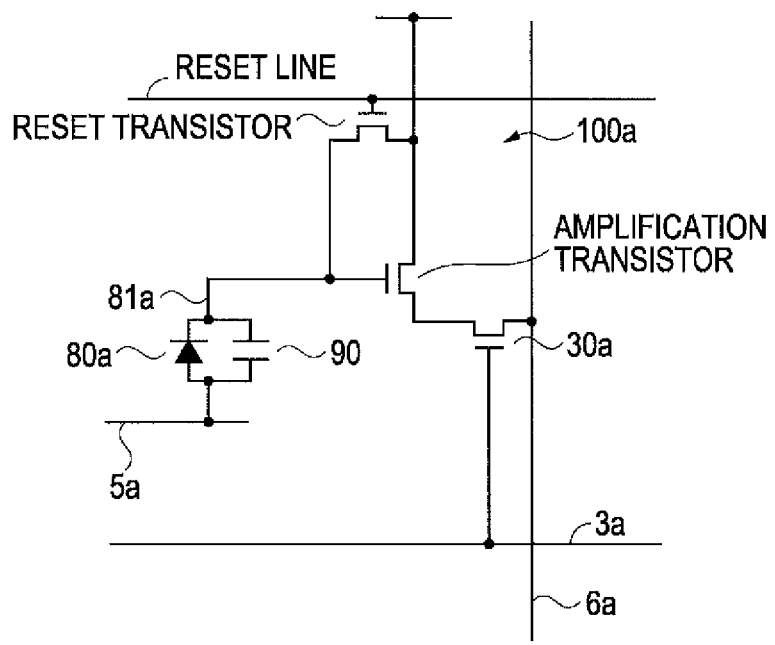
FIG. 12 is a block diagram illustrating a modified embodiment of the first to fourth embodiments of the invention.

Although in the first to fourth embodiments, the electrical signals with improved S/N ratio by the passive pixel type are output to the source line 6a, the S/N ratio may be improved by an active pixel type as illustrated in FIG. 12. According to this type, as illustrated in FIG. 12, by providing an amplifier transistor in the pixel 100a, electric charges generated by the photoelectric conversion element 80a are stored in the storage capacitor 90, and a potential difference in response to a change in the capacitance during the storage is amplified by the amplifier transistor. The amplified electrical signals can be extracted as signal components larger than the noise components generating in the path subsequent to the pixel 100a, whereby an improvement in the S/N ratio can be achieved.

What is claimed is:

1. A solid-state image pickup device comprising:
   a substrate;
   a transistor formed on the substrate;
   a lower insulating layer formed over the transistor;
   a photoelectric conversion element including a first electrode connected to a drain or a source of the transistor via a first contact hole formed in the lower insulating layer, a semiconductor layer stacked on the first electrode, and a second electrode stacked on the semiconductor layer, the first contact hole being formed in a region not overlapping with the semiconductor layer;
   an upper insulating layer disposed on the second electrode; and
   a bias line formed on the upper insulating layer to be connected to the second electrode,
   the upper insulating layer containing at least an inorganic insulating film,
   the bias line being connected to the second electrode via a contact hole formed in the upper insulating layer, and a side surface of the semiconductor layer being in contact with the inorganic insulating film,
   the semiconductor layer being a stacked layer of a plurality of semiconductor films including at least a P-type semiconductor film and an N-type semiconductor film,
   the first electrode being connected to the P-type semiconductor film, and
   the second electrode being connected to the N-type semiconductor film,
   wherein the bias line extends to overlap with the drain or the source of the transistor, further comprising a storage capacitor having an upper electrode formed from the bias line, and a lower electrode formed from the first electrode.

2. The solid-state image pickup device according to claim 1, further comprising a top protection layer that is provided on the upper insulating layer,
   the bias line being covered with the top protection layer.

3. A solid-state image pickup device comprising:
a substrate;
a transistor formed on the substrate;
a photoelectric conversion element including a first electrode connected to a drain or a source of the transistor, a semiconductor layer stacked on the first electrode, and a second electrode stacked on the semiconductor layer;
an upper insulating film disposed on the second electrode;
a bias line formed on the upper insulating film to be connected to the second electrode; and
a lower insulating film formed over the transistor,
the first electrode being connected to a portion of the drain or the source via a first contact hole formed in the lower insulating film, the first contact hole being formed in a region not overlapping with the semiconductor layer, the portion of the drain or the source being sandwiched between the substrate and the first electrode in cross-section view, and the bias line and the second electrode being connected to each other via a contact hole formed in the upper insulating film,
the semiconductor layer being a stacked layer of a plurality of semiconductor films including at least a P-type semiconductor film and an N-type semiconductor film,
the first electrode being connected to the P-type semiconductor film, and
the second electrode being connected to the N-type semiconductor film,
wherein the bias line extends to overlap with the drain or the source of the transistor, the solid-state image pickup device further comprising a storage capacitor having an upper electrode formed from the bias line, and a lower electrode formed from the first electrode.

4. The solid-state image pickup device according to claim 3, the first electrode overlapping with an upper surface of the drain or the source of the transistor.

5. The solid-state image pickup device according to claim 3, the upper insulating film containing an inorganic insulating film.

6. A solid-state image pickup device comprising:
a substrate;
a transistor formed on the substrate;
a photoelectric conversion element including a first electrode connected to a drain or a source of the transistor, a semiconductor layer stacked on the first electrode, and a second electrode stacked on the semiconductor layer; and
a bias line connected to the second electrode,
a lower insulating film being formed between the drain or the source and the first electrode,
the first electrode being electrically connected to the drain or the source by overlapping with an upper surface of the drain or the source within a contact hole formed in the lower insulating film, the contact hole being formed in a region not overlapping with the semiconductor layer,
the semiconductor layer being a stacked layer of a plurality of semiconductor films including at least a P-type semiconductor film and an N-type semiconductor film,
the first electrode being connected to the P-type semiconductor film, and
the second electrode being connected to the N-type semiconductor film,
wherein the bias line extends to overlap with the drain or the source of the transistor, further comprising a storage capacitor having an upper electrode formed from the bias line, and a lower electrode formed from the first electrode.

7. The solid-state image pickup device according to claim 6, the lower insulating film containing an inorganic insulating film.

8. The solid-state image pickup device according to claim 1, wherein the transistor is a channel-stopper type field effect transistor.

9. The solid-state image pickup device according to claim 3, wherein the transistor is a channel-stopper type field effect transistor.

10. The solid-state image pickup device according to claim 6, wherein the transistor is a channel-stopper type field effect transistor.

* * * * *